(12) United States Patent
Tsai et al.

(10) Patent No.: US 12,025,637 B2
(45) Date of Patent: Jul. 2, 2024

(54) PROBE CARD

(71) Applicant: MPI Corporation, Zhubei (TW)

(72) Inventors: Chin-Yi Tsai, Zhubei (TW); Chia-Tai Chang, Zhubei (TW); Cheng-Nien Su, Zhubei (TW); Chin-Tien Yang, Zhubei (TW); Chen-Chih Yu, Zhubei (TW)

(73) Assignee: MPI CORPORATION, Zhubei (TW)

( * ) Notice: Subject to any disclaimer, the term of this patent is extended or adjusted under 35 U.S.C. 154(b) by 324 days.

(21) Appl. No.: 17/499,990

(22) Filed: Oct. 13, 2021

(65) Prior Publication Data

US 2022/0113334 A1 Apr. 14, 2022

Related U.S. Application Data

(60) Provisional application No. 63/137,808, filed on Jan. 15, 2021, provisional application No. 63/091,885, filed on Oct. 14, 2020.

(30) Foreign Application Priority Data

Jul. 12, 2021 (TW) .................................. 110125568
Sep. 8, 2021 (TW) .................................. 110133473

(51) Int. Cl.
G01R 1/073 (2006.01)
(52) U.S. Cl.
CPC .............................. G01R 1/07342 (2013.01)
(58) Field of Classification Search
CPC ............ G01R 1/07342; G01R 1/07378; G01R 1/06727
See application file for complete search history.

(56) References Cited

U.S. PATENT DOCUMENTS 4,871,964 A * 10/1989 Boll ................... G01R 1/07342
324/755.05
7,253,646 B2 8/2007 Lou et al.
7,295,023 B2 11/2007 Lou et al.

FOREIGN PATENT DOCUMENTS

TW 200813436 A 3/2008
TW 202004193 A 1/2020

OTHER PUBLICATIONS

Taiwan Patent Office, "Office Action", dated Jun. 24, 2022, Taiwan.

* cited by examiner

*Primary Examiner* — Lee E Rodak
*Assistant Examiner* — Byung Ro Lee
(74) *Attorney, Agent, or Firm* — Locke Lord LLP; Tim Tingkang Xia, Esq.

(57) ABSTRACT

The present invention provides a probe card comprising a probe base, at least one impedance-matching probes, and a plurality of first probes. The probe base has a probing side and a tester side opposite to the probing side. Each impedance-matching probe has a probing part and a signal transmitting part electrically coupled to the probing part, wherein one end of the signal transmitting part is arranged at tester side, and the signal transmitting part has a central probing axis. Each first probe has a probing tip and a cantilever part coupled to the probing tip, wherein the cantilever part is coupled to the probe base and has a first central axis such that an included angle is formed between the central probing axis and the first central axis.

18 Claims, 16 Drawing Sheets

PROBE CARD

This application claims the benefit of U.S. provisional Patent Application Ser. 63/091,885, filed on Oct. 14, 2020, Ser. 63/137,808, filed on Jan. 15, 2021, Taiwan Application No. 110125568, filed on Jul. 12, 2021, and Taiwan Application No. 110133473, filed on Sep. 8, 2021, the subject matter of which is incorporated herein by reference.

BACKGROUND OF INVENTION

1. Field of the Invention

The present invention is related to a probe card, and more particularly, to a probe card having probe layout of the impedance-matching probes and cantilever probes.

2. Description of the Prior Art

Due to the miniaturization of the electrical elements, it is necessary to inspect the electrical elements to see if there has signal transmission problem of the electrical elements after the semiconductor manufacturing process so as to ensure the quality for manufacturing electrical elements. Generally speaking, when it comes to inspect whether the electrical connections between electrical elements is firmly connected or if the signal transmission is well performed or not, the probe card is utilized as an inspection interface between the tester and the device under test (DUT) such that the quality of the DUT can be determined according to the signal transmission and electrical signal analysis.

Since the communication technology is gradually advanced, conventional probe card that can only inspect single electrical characteristic such as signal characteristic (DC or AC), or radio frequency (RF) characteristic is insufficient to meet inspection requirement of the DUT such as communication elements or RF elements, for example. Although there are inspection devices for inspecting the communication elements or RF elements, the signal characteristic and RF characteristic are separately inspected by the inspection devices dedicated to signal inspection of the communication elements or RF elements. For example, the conventional inspection device comprises first probe card for inspecting the signal characteristic and second probe card for inspecting the RF characteristic, and the first probe card and second probe card are alternately changed to inspect the signal characteristic and RF characteristic. Although the first and second probe cards can respectively be utilized to inspect the different characteristics of the DUT, the throughput time of the inspection will be increased thereby reducing the inspection efficiency of production line.

SUMMARY OF THE INVENTION

In order to solve the above-mentioned problem, the present invention provides a probe card comprising impedance-matching probes for inspecting RF characteristic and cantilever probes providing other inspecting signals whereby the probe card can inspect RF characteristics of DUT or simultaneously inspect RF characteristics and signal characteristics of the DUT. However, conventionally, when it comes to simultaneously inspect RF characteristics and signal characteristics, it is necessary to arrange both impedance-matching probes for inspecting RF characteristics and cantilever probes for signal characteristics at an inspection space of the probe card corresponding to the DUT. Since the size of the probes for inspecting RF characteristics are larger than the size of the cantilever probes, it will easily cause the problem that the density of probe arrangement is reduced or a problem that the impedance-matching probe and the cantilever probes cannot be arranged together due to the interference between the impedance-matching probe and the cantilever probes.

The present invention provides a probe card simultaneously having impedance-matching probes for inspecting RF characteristic and cantilever probes providing other inspecting signals whereby the probe card can inspect RF characteristics of DUT or simultaneously inspect RF characteristics and signal characteristics of the DUT. It is noted that, the inspection of signal characteristic can be, but should not limited to, DC signal inspection of AC signal inspection. In one embodiment of the present invention, through the probe arrangement such as an included angle formed between the central probing axis of the impedance-matching probe and central axis of the cantilever probe, or included angle and height difference between the impedance-matching probe and cantilever probe, not only can the arrangement density of the probes be increased but also the interference between probes can be prevented such that the problem that the probes cannot be properly arranged can be effectively solved. In addition, the probe card of the present invention can simultaneously inspect the signal characteristics and RF characteristics with respect to the electrical contact pads from ed at the same side of the DUT whereby the inspection throughput and inspection efficiency can be greatly increased.

In one embodiment, the present invention provides a probe card for inspecting electrical characteristic of a DUT. The probe card comprises a probe base, at least one impedance-matching probe, and a plurality of first probes. The probe base has a DUT side and a tester side opposite to the DUT side. Each impedance-matching probe comprises a probing part and a signal transmitting part electrically connected to the probing part. One end of the signal transmitting part is arranged at the tester side, and the signal transmitting part passes through a through hole of the probe base such that the probing part is arranged at the DUT side of the probe base, and the signal transmitting part has a central probing axis. Each first probe comprises a needle segment and a cantilever segment connected to the needle segment, wherein one end of the cantilever segment of each first probe is electrically connected to the probe base, each needle segment is arranged at the DUT side corresponding to the through hole, and each cantilever segment has a first central axis. At least one side of each impedance-matching probe has the at least one first probe, and a first included angle larger than zero degree is formed between the central probing axis and the first central axis. In one embodiment, a height of cantilever segment of the first probe disposed on at least one side of each impedance-matching probe is higher than the probing part of the impedance-matching probe such that the first probe can cross over the adjacent impedance-matching probe and diagonally extend to the through hole.

In one embodiment, the present invention further provides a probe card, comprising a probe base, a first probing module, and a second probing module. The probe base is configured to have a DUT side and a tester side opposite to the DUT side. The first probing module is configured to be arranged onto the probe base, wherein the first probing module further comprises at least one impedance-matching probe and a plurality of first cantilever probes. Each impedance-matching probe further comprises a probing part and a signal transmitting part. The probing part has at least two probing segments and the signal transmitting part is electrically coupled to the probing part. Each first cantilever probes comprising a needle segment, and a cantilever segment connected to the needle segment. A first probing area is formed by the probing part of the at least one impedance-matching probe, and the needle segments of the first cantilever probes. The second probing module is arranged on the probe base and at a side of the first probing module. Each second probing module comprises a plurality of second cantilever probes. Each second cantilever probe comprises a needle segment, and a cantilever segment connected to the needle segment. A second probing area is formed by the needle segments of the plurality of second cantilever probes. A distance between the first probing area and the second probing area is greater than a distance between two needle segments of any two second cantilever probes.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a probe card. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1A:
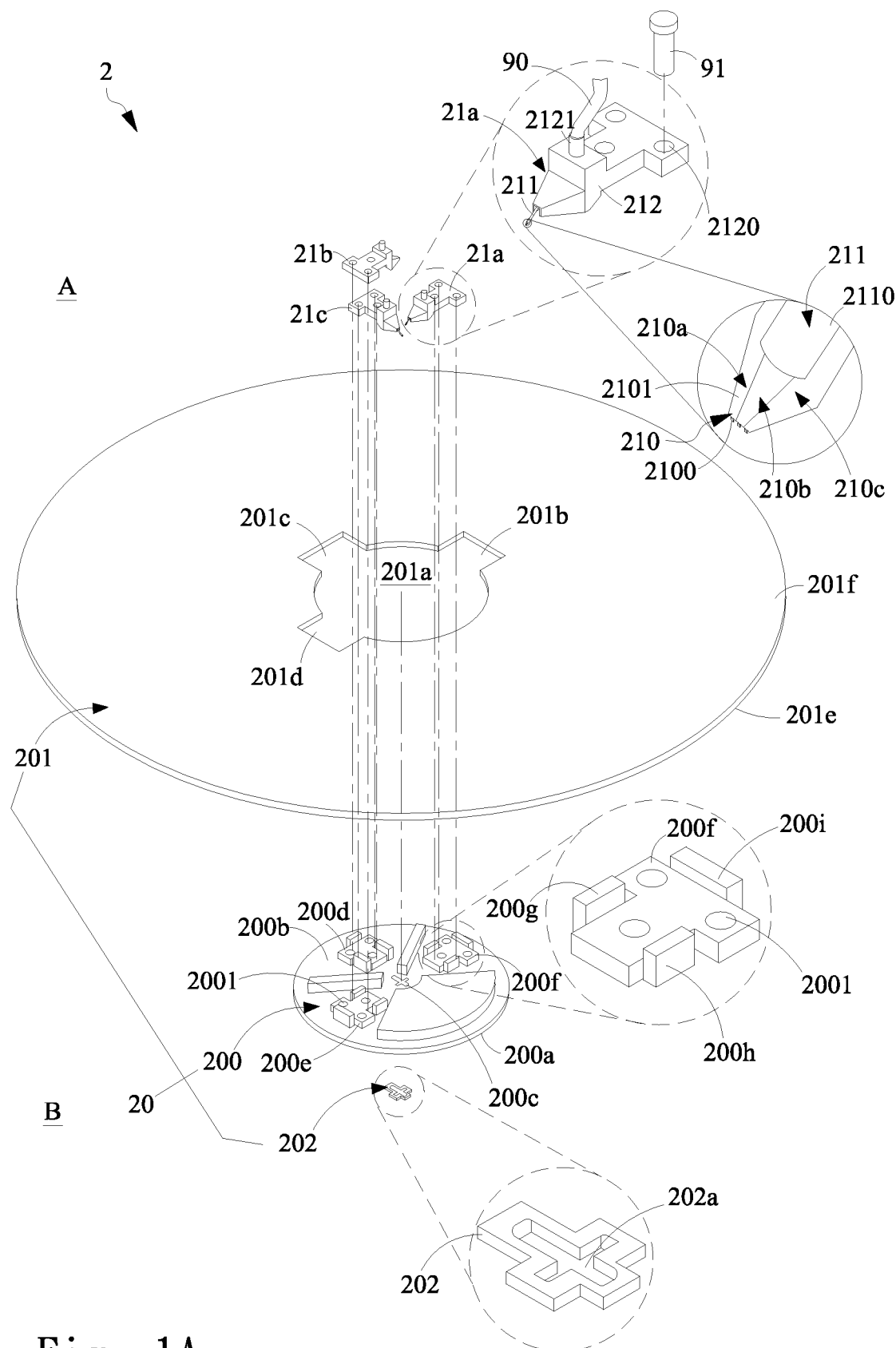
FIG. 1A illustrates an explosive view of the probe card according to one embodiment of the present invention.
Figure 1B:
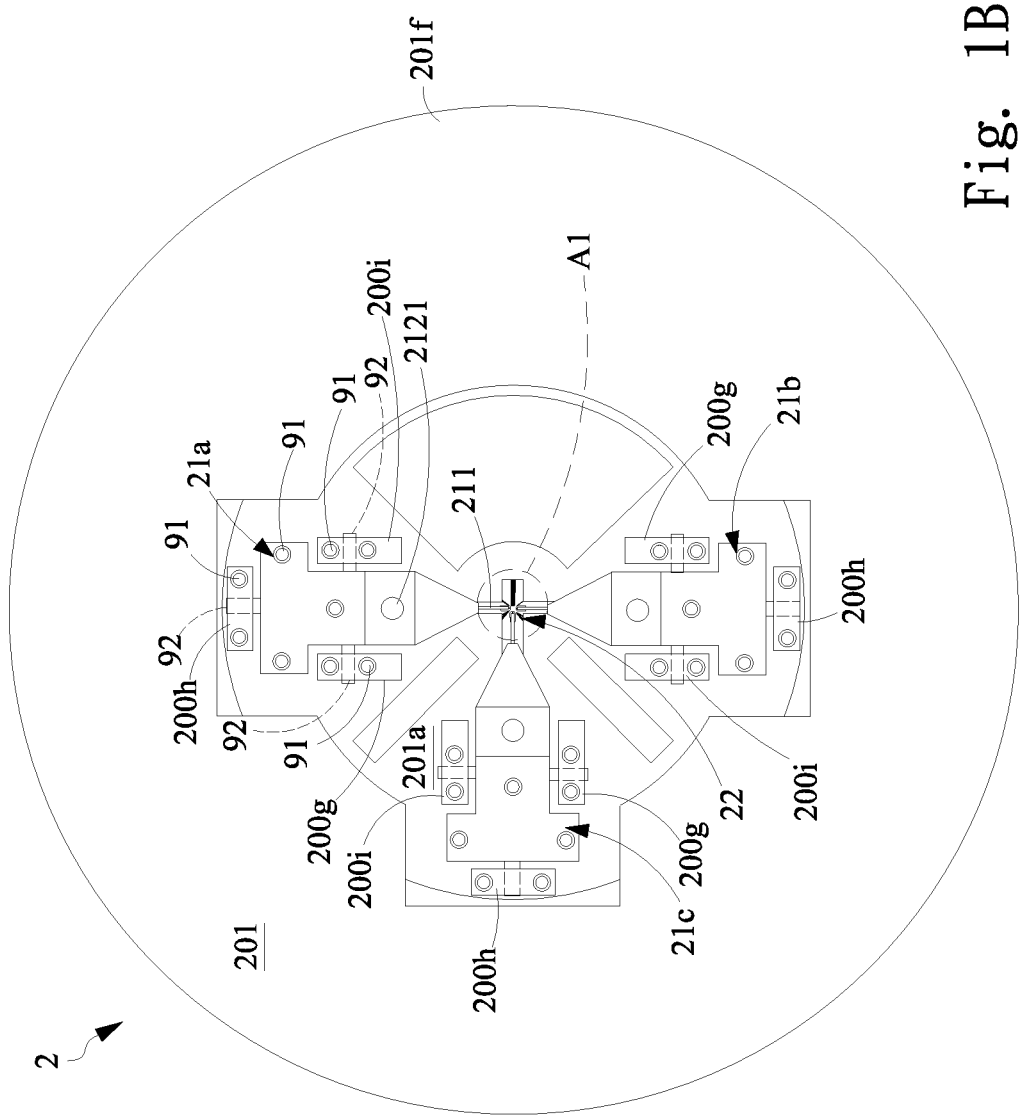
FIG. 1B illustrates a top view of the probe card according to one embodiment of the present invention.

Please refer to FIGS. 1A and 1B, wherein FIG. 1A illustrates an explosive view of the probe card according to one embodiment of the present invention while FIG. 1B illustrates a top view of the probe card according to one embodiment of the present invention. In the present embodiment, the probe card 2 comprises a probe base 20, a plurality of impedance-matching probes 21a~21c and a plurality of first probes 22. The probe base 20 has a tester side A and a DUT side B in which the tester side A is located at top side of the probe base 20, and the DUT side B is located at the bottom of the probe base 20. The probe base 20 comprises a supporting substrate 200, electrical substrate 201, and a positioning structure 202. The supporting substrate 200, in the present embodiment, is made of metal material but it is not limited to the metal material. The supporting substrate 200 further comprises a first surface 200a at the DUT side B, a second surface 200b at the tester side A, and a first through hole 200c passing through the first and second surfaces 200a and 200b.

In one embodiment of the supporting substrate 200, it further comprises a plurality of supporting base 200d~200b, each of which has a first engaging hole 2001. A plurality of positioning plates 200g~200i are arranged around each supporting base 200d~200f. In one embodiment, the plurality of positioning plates 200g~200i are arranged at the two lateral sides and rear sides of the corresponding supporting base 200d~200f. The electrical substrate 201 is arranged at the second surface 200b and has a second through hole 201a corresponding to the first through hole 200c. In the present embodiment, a peripheral of the second through hole 200a further has a plurality of indentation parts 201b~201d respectively corresponding to the supporting bases 200d~200f. When the electrical substrate 201 is assembled to the supporting substrate 200, the supporting bases 200d~200f and the corresponding positioning plates 200g~200i running through the corresponding indention parts 201b~201d, respectively.

The positioning structure 202 is disposed at the DUT side B and is connected to the first surface 200a of the supporting substrate 200. In the present embodiment, the positioning structure 202 has a through hole 202a, and is a structure made by isolating material, such as ceramic material, for example. The through hole 202a has a cross shape, which is designed according to the user's need, and is not limited by the shape shown in the figures of the present embodiment. When the positioning structure 202 is assembled to the first surface 200a of the supporting substrate 200, the through hole 202a is corresponding to the second through hole 201a and the first through hole 200c. The plurality of impedance-matching probes 21a~21c are respectively arranged onto the supporting base 200d~200f, wherein the impedance-matching probe 21a is arranged onto the supporting base 200f, the impedance-matching probe 21b is arranged onto the supporting base 200e, and the impedance-matching probe 21c is arranged onto the supporting base 200d.

In the present embodiment, each impedance-matching probes 21a~21c further comprises a probing part 210, signal transmitting part 211, and a structural body 212. Taking impedance-matching probe 21a as an example, the structural body 212 further comprises a plurality second engaging holes 2120 respectively corresponding to the first engaging holes 2001 of the supporting base 200f. The engaging elements 91, such as screw or bolt, for example, can pass through the first and second engaging holes 2001 and 2120 so as to fix the structural body 212 onto the corresponding supporting base 200f. The structural body 212 comprises a signal connector 2121 electrically connected to the signal transmitting part 211, wherein a cable 90 has one end electrically coupled to the signal connector 2121, and the other end of the cable 90 electrically coupled to the tester for performing an unidirectional transmission, i.e. from tester to probing part 210 or from probing part 210 to tester. During the inspection, the tester transmits testing signal to the signal connector 2121 through the cable 90. The testing signal is transmitted to the probing part 210 through the signal transmitting part 211 and then is transmitted to the DUT. Alternatively, during the inspection, the tester transmits the testing signal to the DUT through probes that are different from the impedance-matching probes 21a~21c, such as first probes, for example, and then the tester receives the inspection result through the impedance-matching probes 21a~21c and analyzes the inspection result.

The probing part 210 is formed by semiconductor process and is electrically connected to the signal transmitting part 211. In the present embodiment, the probing part 210 comprises three sub probing elements 210a~210c. Each probing element 210a~210c comprises a needle segment 2100, and a connecting segment 2101, wherein one end of the needle segment 2100 is electrically contacted with the electrical contact pad of the DUT while the other end of the needle segment 2100 is electrically connected to the connecting segment 2101 electrically coupled to the signal transmitting part 211. The needle segment 2100 is manufactured through microelectromechanical systems (MEMS) process. In the present embodiment, the signal transmitting part 211 is a half-rigidity coaxial cable that comprises inner conductor, dielectric layer covered the inner conductor, and outer conductor 2110 wherein the inner conductor and outer conductor 2110 are respectively coupled to the connecting segment 2101. The signal transmitting part 211 passes through the second through hole 201a of the electrical substrate 201, first through hole 200c of the supporting substrate 200, and through hole 202a of the positioning structure 202 from the tester side A such that the probing part 210 is arranged at the DUT side B of the probe base 20. The needle segment 2100 can be, but should not be limited to, a SG needle having one signal needle and one ground needle, a GSG needle having one signal needle and two ground needles, a GSSG needles having two signal needles and two ground needles, or a GSGSG needle having two signal needles and three ground needles.

Figure 1D:
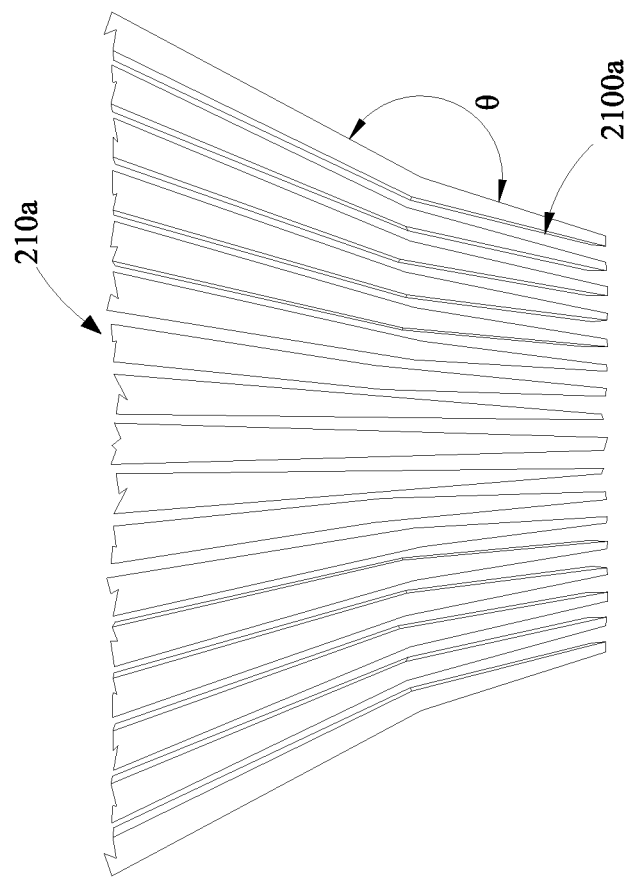
FIGS. 1C and 1D respectively illustrate impedance-matching probes according to different embodiments of the present invention.
Figure 1C:
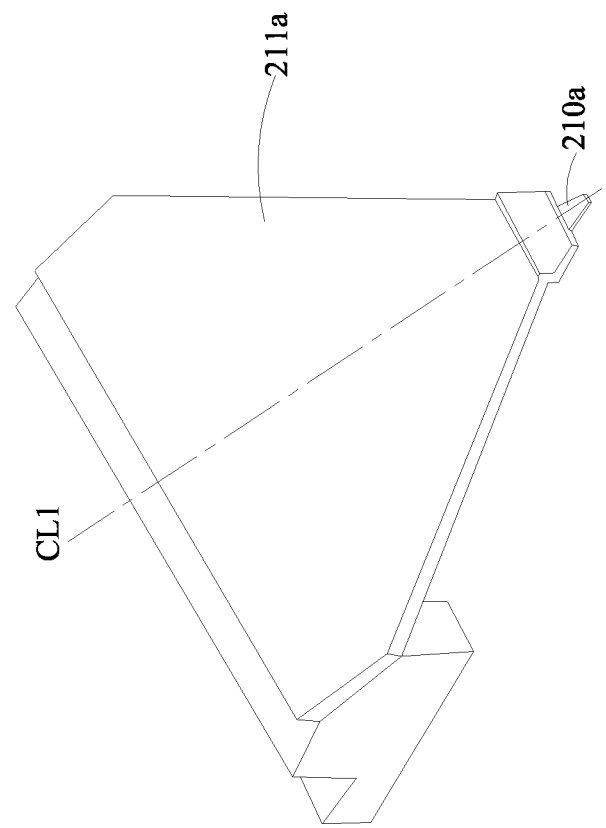

Please refer to FIGS. 1C and 1D, which respectively illustrate impedance-matching probes according to different embodiments of the present invention. In the embodiment shown in FIG. 1C, the different part from the previous embodiment is that the signal transmitting part 211a is not a coaxial cable architecture but a structure formed by printed-circuit board (PCB) having impedance-matching and signal-transmitting function, instead, wherein the front end of the PCB has probing part 210a. In FIG. 1D, the different part is that the probing part 210a comprises a plurality of probing needles, and each probing needle has a bending angle θ, wherein one end of each probing needle has a needle segment 2100a. The probing part 210a has at least two needle segments 2100a. In the present embodiment, there are 17 needle segments 2100a which are more than the amount of needle segment 2100 of impedance-matching probe shown in FIG. 1A. The signal transmitting part 211a has central probing axis CL1.

Please refer to FIGS. 1A and 1B, the signal transmitting part 211 of each impedance-matching probe 21a~21c is symmetrically about the central probing axis CL1. In addition, the signal transmitting part 211a shown in FIG. 1C is also symmetrically about the central probing axis CL1. It is noted that, in the present embodiment, when the signal transmitting part 211a of the impedance-matching part shown in FIG. 1C has a shape of axial symmetry, the symmetrical axis is regarded as the central probing axis CL1.

Figure 2A:
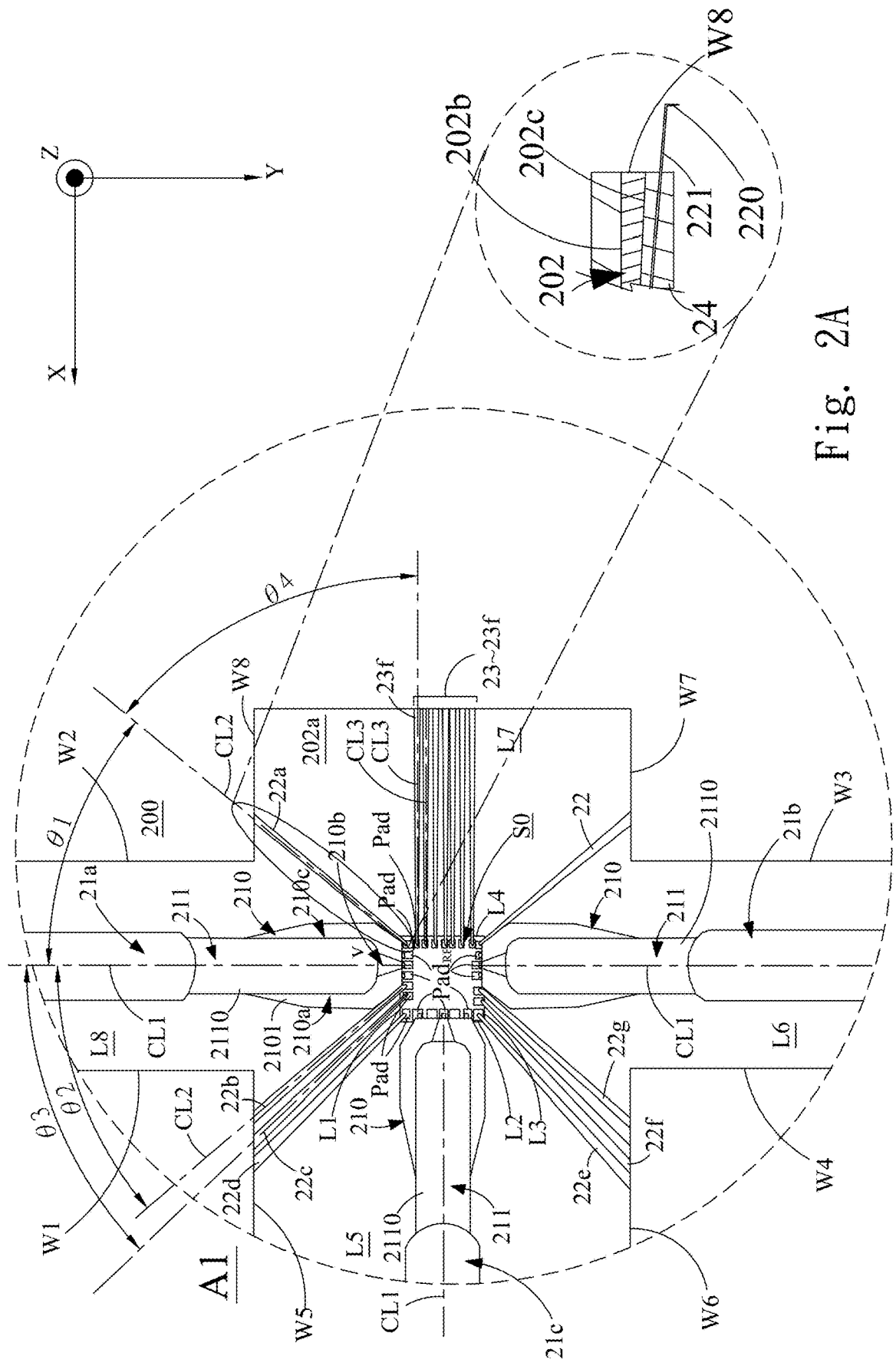
FIG. 2A illustrates a top view with respect to arrangement relation between impedance-matching probes and first probes according to one embodiment of the present invention.
Figure 2B:
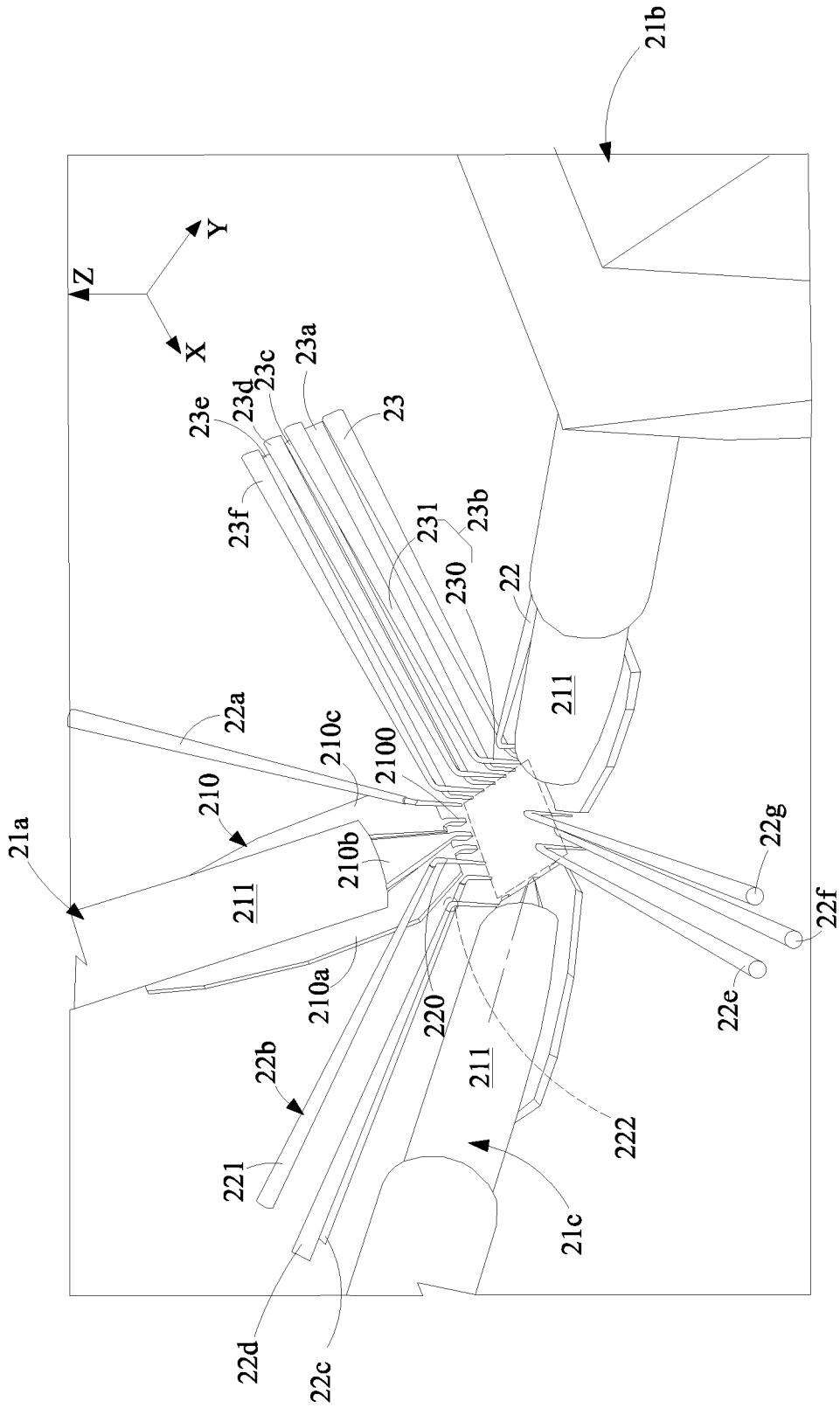
FIG. 2B illustrates a perspective view with respect to arrangement of impedance-matching probes and first probes.
Figure 2C:
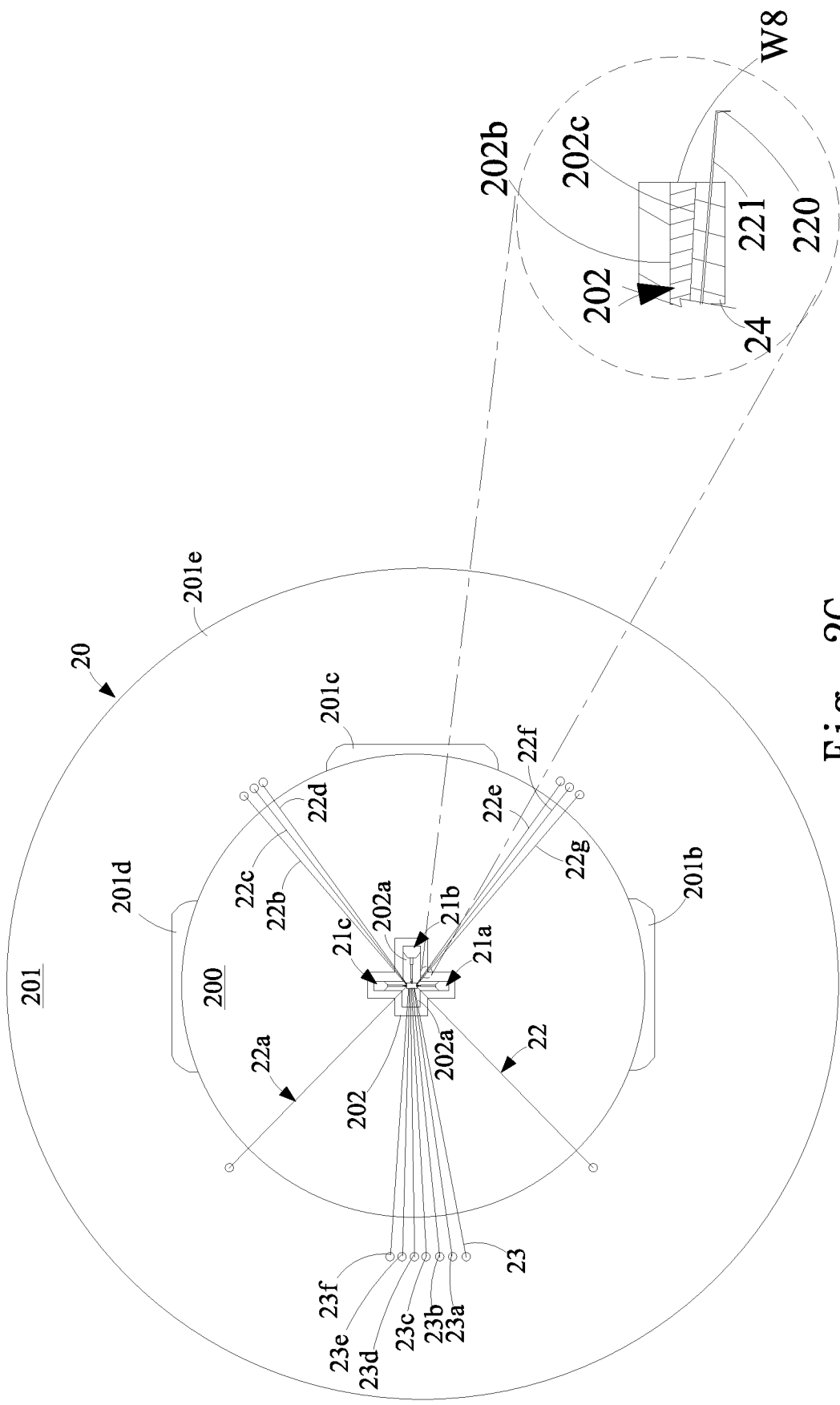
FIG. 2C illustrates a bottom view of the probe card from the DUT side according one embodiment of the present invention.

Please refer to FIGS. 1A-1B and FIGS. 2A-2C, in which the FIG. 2A illustrates a top view with respect to arrangement relation between impedance-matching probes and first probes according to one embodiment of the present invention, FIG. 2B illustrates a perspective view with respect to arrangement of impedance-matching probes and first probes, and FIG. 2C illustrates a bottom view of the probe card from the DUT side according one embodiment of the present invention. In the present embodiment, the signal transmitting part 211 of each impedance-matching probe 21a~21c is extended straightly, which is explained as below. In the present embodiment according to a top view from XY plane, the positioning structure 202 has an opening slots L5 and L7 along the X axis, and opening slots L6 and L8 along the Y axis. The impedance-matching probe 21a is arranged at the second surface 200b of supporting substrate 200, and the signal transmitting part 211 thereof passes through the electrical substrate 201, supporting substrate 200 and opening slot L8 from the second surface 200b, and is straightly extended along the Y axis associated with the XY plane. The impedance-matching probe 21b is arranged at the second surface 200b of supporting substrate 200, and the signal transmitting part 211 passes through the electrical substrate 201, supporting substrate 200 and opening slot L6 from the second surface 200b, and is straightly extended along the −Y axis associated with the XY plane. The impedance-matching probe 21c is arranged at the second surface 200b of supporting substrate 200, and the signal transmitting part 211 passes through the electrical substrate 201, supporting substrate 200 and opening slot L5 from the second surface 200b, and is straightly extended along the −X axis associated with the XY plane. It is noted that the opening slots L8, L6, and L5 corresponding to the impedance-matching probes 21a~21c are determined according to the position and quantity of impedance-matching probes and it is not limited to the three opening slots shown in the preset embodiment. In addition, the first axis X has a first positive axial direction +X and a first negative axial direction −X, and the second axis Y has a second positive axial direction +Y and a second negative axial direction −Y.

At least one side of each impedance-matching probe 21a~21c has at least one cantilever probe. In the embodiment shown in FIGS. 2A to 2C, there has first probes 22~22g arranged at the two lateral side of each impedance-matching probe 21a~21c. In the present embodiment, the first probes 22~22g are cantilever probes, each of which has a needle segment 220 and a cantilever segment 221 connected to the needle segment 221 wherein a part of the cantilever segment 221 of each first probe 22~22g is arranged onto the positioning structure 202 and two ends of the cantilever segment 221 are respectively extended to the electrical substrate 201 and the needle segment 220. In the present embodiment, each first probe 22~22g further comprises a knee segment 222 connected between the needle segment 220 and the cantilever segment 221. The needle segment 220 is extended along Z axis from the knee segment 222. In the present embodiment, one end of the cantilever segment 221 is electrically connected to the electrical substrate 201, and the needle segment 220 is arranged corresponding to the through hole 202a. One end of the cantilever segment 221 is electrically connected to the contact pad of the electrical substrate 201 through solder, or through a medium, e.g., coaxial cable having one end connected to the one end of the cantilever segment 222 and the other end connected to the contact pad of the electrical substrate 201. Please refer to FIG. 1A, the electrical substrate 201 has a third surface 201e at DUT side B and the fourth surface 201f at tester side A. One end of the cantilever segment 221 is electrically connected to the contact pad formed on the third surface 201e of the electrical substrate 201. In addition, the supporting substrate 200 is arranged on the third surface 201e of the electrical substrate 201. It is noted that since each impedance-matching probe 21a~21c has volume to occupy a certain space within of through hole 202a, in order to prevent the first probes 22~22g from interfering with the impedance-matching probes 21a~21c or to ensure the first probes 22~22g can avoid the arrangement area of the impedance-matching probes 21a~21c, the first probes 22~22g will not be directly arranged toward the opening slots L5~L7 respectively corresponding to each impedance-matching probes 21a~21c along the X axial direction or Y axial direction, but are diagonally extended to area under the through hole 202a along a direction having an included angle with the extending direction of impedance-matching probes 21a~21c, instead, whereby the interference between the first probes 22~22g and impedance-matching probes 21a~21c can be avoided.

Taking the impedance-matching probe 21a as one example, the opening slot L8 corresponding thereto has side walls W1 and W2 respectively corresponding to the two lateral sides signal transmitting part 211 of the impedance-matching probe 21a on XY plane. Taking the impedance-matching probe 21b as one example, the opening slot L6 corresponding thereto has side walls W3 and W4 respectively corresponding to the two lateral sides signal transmitting part 211 of the impedance-matching probe 21b on XY plane. Taking the impedance-matching probe 21c as one example, the opening slot L5 corresponding thereto has side walls W5 and W6 respectively corresponding to the two lateral sides signal transmitting part 211 of the impedance-matching probe 21c on XY plane. Please refer to FIG. 2A, in the present embodiment, the first probe 22a or first probes 22b~22d arranged at at least one side of the impedance-matching probe 21a are diagonally extended to the area under the through hole 202a from seal layer 24 formed under the side walls W5 and W8 located along X axis of opening slots L5 and L7 of positioning structure 202. For the impedance-matching probe 21b, the first probe 22 or the first probes 22e~22g arranged at at least one side of the impedance-matching probe 21b are diagonally extended to the area under the through hole 202a from seal layer 24 formed under the side walls W6 and W7 located along X axis of opening slots L5 and L7 of positioning structure 202. For the impedance-matching probe 21c, the first probe 22d or 22e arranged at at least one side of the impedance-matching probe 21c are diagonally extended to the direction under the through hole 202a from seal layer 24 formed under the side walls W5 and W6 located along X axis of opening slots L5 of positioning structure 202.

It is further explained that, in the present embodiment, the extended direction of the first probe 22a disposed at lateral side of the impedance-matching probe 21a is that the cantilever segment 221 thereof is extended along the direction between +X and +Y axes toward the through hole 202a, i.e. the cantilever segment 221 of the first probe 22a diagonally extended to through hole 202a from seal layer 24 under the side wall W8 such that an included angle θ1 more than zero degree is formed between the first central axis CL2 of the cantilever segment 221 of the first probe 22a and central probing axis CL1 of the impedance-matching probe 21a. The extended direction of the first probe 22b~22c disposed at lateral side of the impedance-matching probe 21a is that the cantilever segment 221 is extended along the direction between −X and +Y axes toward the through hole 202a, i.e. the cantilever segment 221 of the first probes 22b~22c diagonally extended to through hole 202a from seal layer 24 under the side wall W5 such that included angles θ2 and θ3 more than zero degree are formed between the second central axes CL2 of the cantilever segment 221 of the first probes 22b~22c and central probing axis CL1 of the impedance-matching probe 21a, respectively.

For the impedance-matching probe 21b, cantilever segment 221 of the first probe 22 at one side of the impedance-matching probe 21b is extended to the direction between +X and −Y axes under the through hole 202a, i.e. the cantilever segment 221 of the first probe 22 diagonally extended to through hole 202a from seal layer 24 under the side wall W7. The cantilever segment 221 of the first probes 22e~22g at the other side of the impedance-matching probe 21b are extended to the direction between −X and −Y axes under the through hole 202a, i.e. the cantilever segment 221 of the first probes 22e~22g diagonally extended to through hole 202a from seal layer 24 under the side wall W6. For the impedance-matching probe 21c, cantilever segment 221 of the first probe 22e at one side of the impedance-matching probe 21c is extended to the direction between −X and −Y axes under the through hole 202a, i.e. the cantilever segment 221 of the first probe 22e diagonally extended to through hole 202a from seal layer 24 under the side wall W6. The cantilever segment 221 of the first probe 22d at the other side of the impedance-matching probe 21c are extended to the direction between −X and +Y axes under the through hole 202a, i.e. the cantilever segment 221 of the first probes 22d diagonally extended to through hole 202a from seal layer 24 under the side wall W5.

It is noted that, in one alternative embodiment, considering the issues associated with angle and cross arrangement of probes due to the needle tips of probing parts 210 of impedance-matching probes 21a~21c are tiny, in addition to diagonally extending the first probes 22~22g, the height of cantilever segments 221 along −Z axis are higher than a part of the signal transmitting part 211 within the projection area under the through hole 202a such that the interference between cantilever segments 221 and probing part 210 can be effectively prevented. More specifically speaking, it can be effectively prevent the cantilever segment 221 from contacting with the signal transmitting part 211 or probing part 210. In the present embodiment, the positioning structure 202 has a connecting surface 202b connected to the first surface 200a and a supporting surface 202c having the seal layer 24 formed thereon, wherein the cantilever segments 221 of the first probes 22~22g corresponding to the supporting surface 202c are covered with the seal layer 24. It is noted that a part of the cantilever segment 221 of each first probes 22~22g from seal layer 24 to needle segment 220 is arranged at the DUT side B under the through hole 202a without being arranged inside the through hole 202a.

Please refer to FIG. 2A, the DUT S0 is a radio frequency (RF) element having four lateral sides L1~L4. In the present embodiment, the impedance-matching probes 21a~21c are arranged corresponding to the lateral sides L1~L3, respectively. Each lateral side L1~L3 has a plurality of first electrical contact pads $Pad_{RF}$ and a plurality of second electric contact pads (Pad) arranged at at least one side of the first electrical contact pads $Pad_{RF}$ such that the first electrical contact pads $Pad_{RF}$ and second electrical contact pads (Pad) of at least one lateral sides L1~L4 can be simultaneously inspected by the impedance-matching probes 21a~21c and first probes 22~22g. For example, in the present embodiment, each impedance-matching probes 21a~21c inspects at least two first electrical contact pads $Pad_{RF}$ of at least one lateral sides L1~L4 as well as the first probes 22~22g arranged at two sides of each impedance-matching probes 21a~21c are available to inspect the second electrical contact pads (Pad) formed at the same lateral side where the first electrical contact pads $Pad_{RF}$ are formed. When the layout of probe arrangement are corresponding to the layout of the electrical contact pads formed on the DUT, the included angle between the central probing axis CL1 of each impedance-matching probe 21a~21c and the first central axis CL2 of the first probes 22~22g arranged at two sides of the each impedance-matching probes 21a~21c is greater than zero degree. In addition, the included angle between the central probing axis CL1 of each impedance-matching probe 21a~21c and the first central axis CL2 of the first probes 22~22g arranged at the same side or different side of the each impedance-matching probes 21a~21c can be the same as each other or different from each other. For example, the included angle θ1 and θ2 at two sides of the impedance-matching probe 21a shown in FIG. 2A can be the same as or different from each other. Alternatively, the included angle θ2 and θ3 at the same side of the impedance-matching probe 21a can be the same as or different from each other.

In addition to the probe arrangement of the first probes 22~22g and the impedance-matching probes 21a~21c with respect to the opening slots L5~L7, a plurality of second probes 23~23f under the opening slot L8 of through hole 202a are straightly extended to the through hole 202a along the +X axis of XY plane. The second probes 23~23f are cantilever probes having needle segment 230 and cantilever segment 231. In the present embodiment, each second probe 23~23f has a second central axis CL3 parallel to each other. In an alternative embodiment, an included angle can be formed between any two of the second probes 23~23f, which is depending on the probe arrangement of the second probes 23~23f and it is not limited to the parallel arrangement shown in FIG. 2A. In the present embodiment, the two sides second probes 23~23f respectively have first probe 22 and 22a. Since the second probes 23~23f are extended along +X direction on the XY plane, an included angle θ4 larger than zero degree is formed between the second central axis CL3 of second probe 23f and the first central axis CL2 of the adjacent first probe 22a that is extended to the through hole 202a toward a direction between +X axis and +Y axis. Likewise, the included angle greater than zero degree is formed between the second central axis CL3 of the second probe 23 and the first central axis CL2 of the adjacent first probe 22 that is extended to the through hole 202a between +X axis and -Y axis. It is noted that, the second probes 23~23f are not the necessary elements for implementing the present invention, and are arranged according to the use's need; therefore, the second probes 23~23f are not the limitation of the present invention.

Figure 2D:
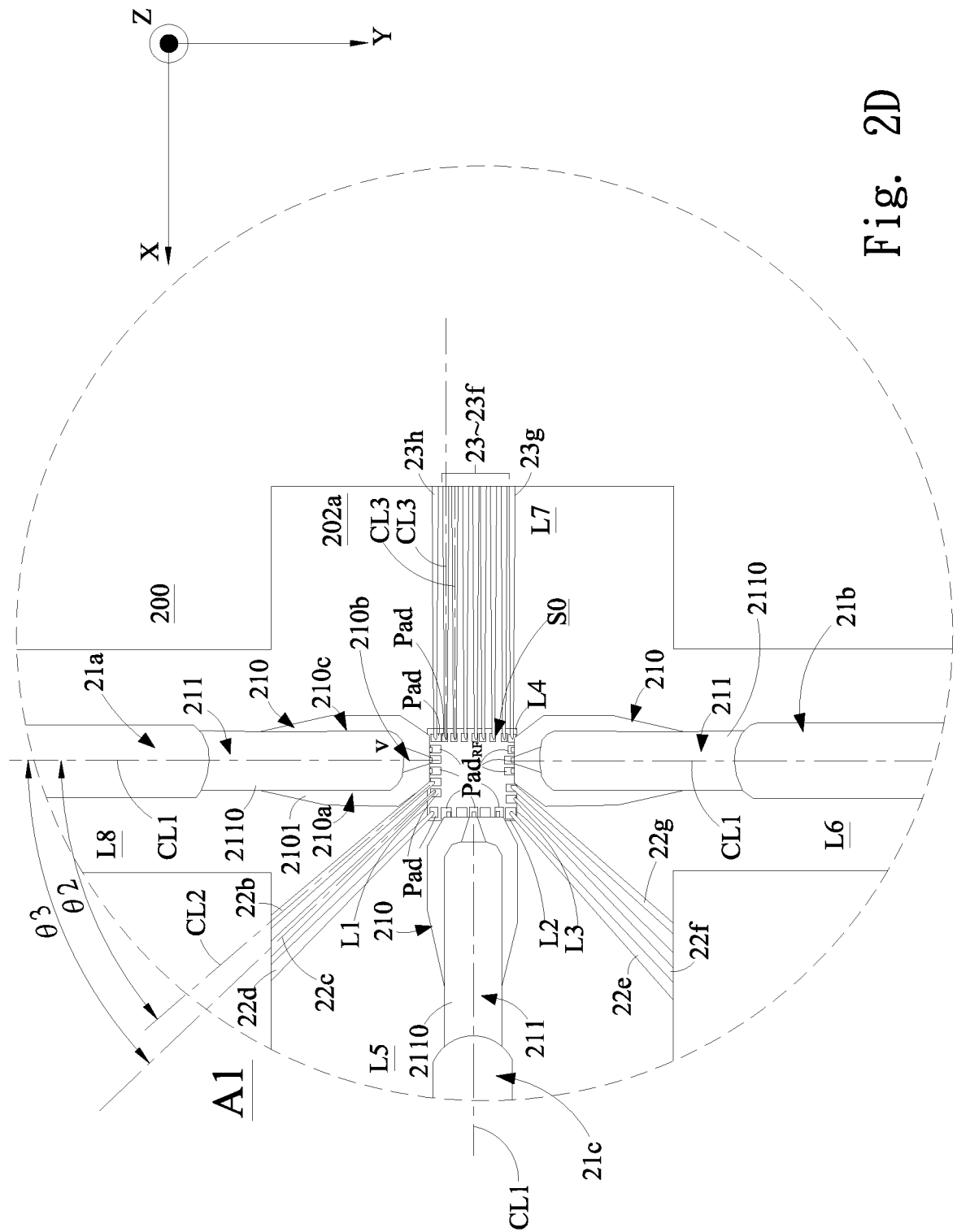
FIGS. 2D and 2E respectively illustrate different embodiments with respect to layout of first and second probes of the present invention.
Figure 2E:
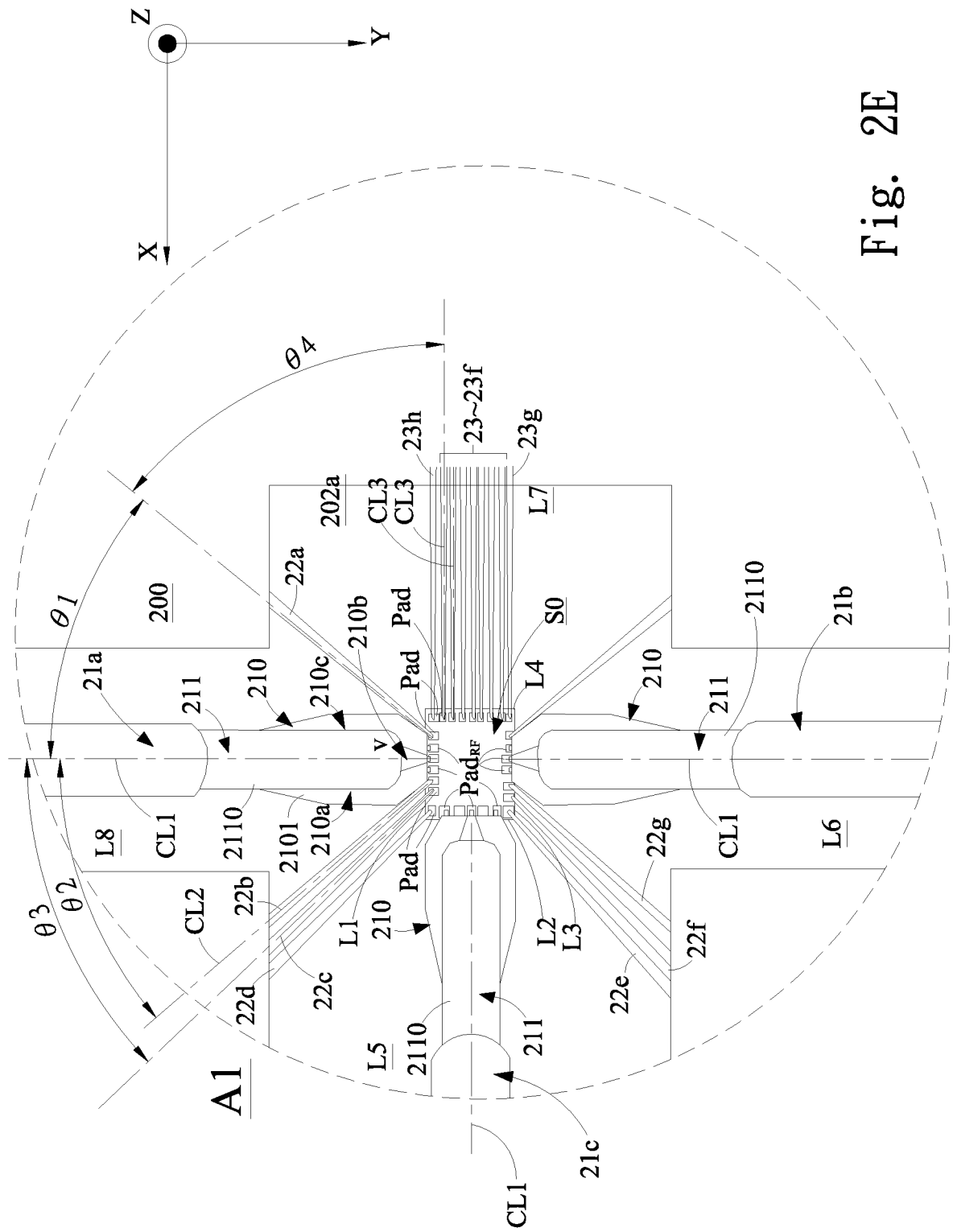

It is also noted that, the probe arrangement between the first probes 22, 22a and second probes 23~23f are not limited by the previously-described embodiments, and the probe arrangement is designed according to the position of the impedance-matching probes 21a, 21b and layout of the second electrical contact pads (Pad) of DUT S0 in the projection area under the opening slot L7. For example, please refer to the FIG. 2A, the second electrical contact pads (Pad) of the DUT S0 between the impedance-matching probes 21a, 21b and opening slot L7 are arranged at lateral side L4 of DUT S0 along the Y axis. Under the layout of the second electrical contact pads (Pad), the cantilever probes can be arranged by combining the first probes 22, 22a and second probes 23~23f together shown in FIG. 2A, or be arranged by combining second probes 23g, 23h with the second probes 23~23f shown in FIG. 2D. In addition, like the embodiment shown in FIG. 2E, if there has at least one second electrical contact pad (Pad) at lateral sides L1 and L3 of DUT S0 along X axis except one row of the second electrical contact pads (Pad) arranged along the lateral side L4 between the impedance-matching probes 21a, 21b and opening slot L7, then like the embodiment shown in FIG. 2E, it must be necessary to configure the probe arrangement having coexistence of second and third probes.

Figure 3B:
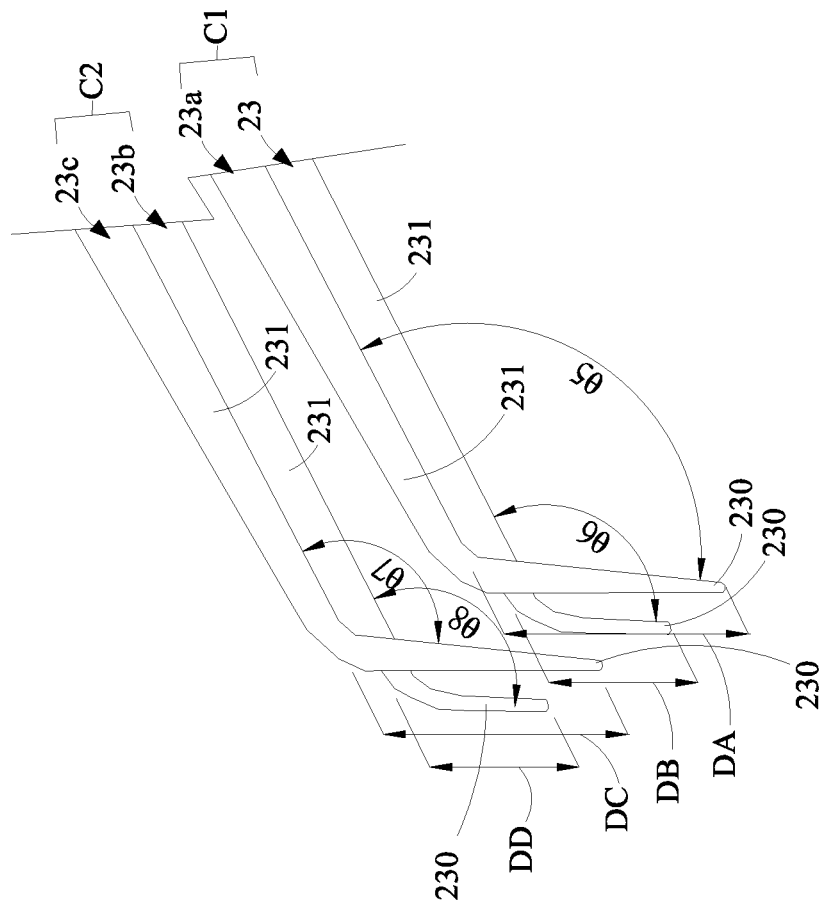
FIG. 3B illustrates arrangement of second probes according to one embodiment of the present invention.
Figure 3A:
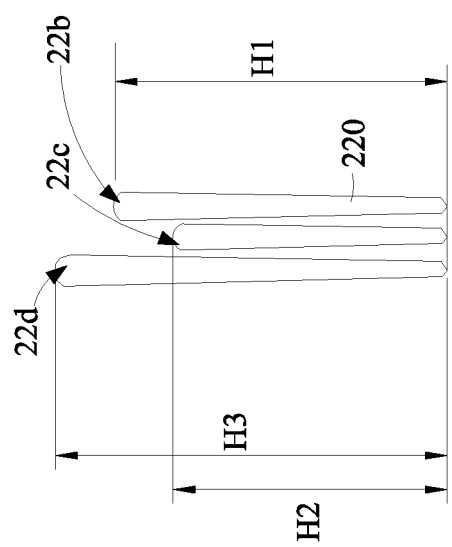
FIG. 3A illustrates arrangement of first probes according to one embodiment of the present invention.

Please refer to FIG. 3A, which illustrates arrangement of first probes according to one embodiment of the present invention. In the present embodiment, the height associated with needle segment 220 of each first probe is different from each other. Taking first probe 22b~22d as example, the needle segment 220 of the first probe 22b has height H1, the needle segment 220 of the first probe 22c has height H2, and the needle segment 220 of the first probe 22d has height H3, wherein the H2<H1<H3. Likewise, for the second probes, the height of needle segment 230 can be different from each other. In one embodiment of probe arrangement associated with second probes shown in FIG. 3B, taking second probe 23, 23a of first probing module C1 and second probe 23b, 23c of the second probing module C2 as example, the height DA with respect to the needle segment 230 of second probe 23a and height DB with respect to the needle segment 230 of second probe 23 are different from each other while the height DC with respect to the needle segment 230 of second probe 23c and height DD with respect to the needle segment 230 of second probe 23b are different from each other. In addition, included angles θ5~θ8 are defined between the needle segment 230 and cantilever segment 231 of each second probes 23~23c, respectively, wherein θ5 is equal to θ6, θ7 is equal to θ8, θ5 is not equal to θ7, and θ6 is not equal to θ8. Through the different height of needle segment 230 between second probes 23~23f, the density of the second probes 23~23f can be increased whereby the probe arrangement of the second probes 23~23f can be adapted to DUT having high density of electrical contact pads. It is noted that the height differences and included angles with respect to different layer of the second probes depend on the use's need and are not limited to the exemplary height difference and included angle shown in the preset embodiment.

Please refer back FIG. 2A, in this embodiment, the probe arrangement is adapted to inspect RF characteristic or RF characteristics as well as signal characteristics of single DUT S0. At least one side of the impedance-matching probes 21a~21c has cantilever probes such as first probes, for example, having different extending direction from the impedance-matching probes such that the electrical contact pads formed on the same lateral side of the DUT S0 can be simultaneously inspected by the impedance-matching probes and cantilever probes. In another embodiment, the probe arrangement is not limited to inspect single DUT. Form example, the probe arrangement shown in FIGS. 4A to 4D could be utilized to inspect a plurality of DUTs at the same time. In the embodiment shown in FIGS. 4A to 4D, the probe card 2a is basically similar to the probe card 2 inspecting single DUT described previously. The different part is the probe arrangement. In the present embodiment, the probe arrangement can be utilized to inspect a plurality of DUTs, such as simultaneously inspecting DUTs S1 and S4. The probe card 2a comprises a first probing module PC1 and the second probing module PC2, in which the first probing module PC1 comprises impedance-matching probes 21a~21c for inspecting RF characteristics or comprises impedance-matching probes 21a~21c and cantilever probes for inspecting RF characteristic as well as signal characteristics which can be, but should not be limited to, AC or DC characteristics, and the second probing module PC2 comprises cantilever probes for inspecting signal characteristics.

In the present embodiment, there has a plurality of DUTs, such as wafer having a plurality dies as the DUTs. In the following explanation, four DUTs S1~S4 are utilized as example for explanation. The plurality of DUTs are sequentially shifted from the side of second probing module PC2 to the side of the first probing module PC1. Each DUT S1~S4 is firstly inspected by the second probing module PC2 for testing the signal characteristics, and then inspected by the first probing module PC1 for testing the RF characteristics or testing RF and signal characteristics simultaneously. During the process of inspection, please refer to FIG. 4A, the DUT S1 enters to the inspection area corresponding to the second probing module PC2 whereby the second probing module PC2 can inspect the signal characteristics of the DUT S1. At this time point, the DUTs S2 and S3 are behind the DUT S1 without entering the inspection area of the second probing module PC2 and there has no DUTs entering the inspection area corresponding to the first probing module PC1. After the inspection of DUT S1, a relative movement is performed such that the DUT S2 is corresponding to the inspection area of the second probing module PC2. In the present embodiment, the distance between the first probing module PC1 and the second probing module PC2 is corresponding to two DUTs in the inspection area of the probe card 2a corresponding to the DUTs. Therefore, when the DUT S4 is relatively moved to the inspection area corresponding to the second probing module PC2, the DUT S1 is relatively moved to the inspection area corresponding to the first probing module PC1 as shown in FIG. 4B. At this time point, the DUTs S2 and S3 are the interval between the first probing module PC1 and the second probing module PC2. It is noted that although there has two DUTs S2~S3 as the interval between the first probing module PC1 and the second probing module PC2, the separation distance is not limited to two DUTs S2 and S3. At least one DUT can be sufficient to be the interval between the first probing module PC1 and the second probing module PC2. In another embodiment, the first probing module PC1 is adjacent to the second probing module PC without any DUT as the interval between the first probing module PC1 and the second probing module PC2. In the present embodiment, the first probing module PC1 comprises a plurality of impedance-matching probes 21a~21c and the first and the second probes 22~22g and 23~23f. The features of the impedance-matching probes 21a~21c and the first and the second probes 22~22g and 23~23f are the same as the previously-described embodiment, which will not be described hereinafter.

In the present embodiment, the second probing module PC2 comprises a plurality of third probes 25a~25i and a plurality of fourth probes 26~26f. The third probes 25a~25i are straightly extended along +X axis on the XY plane from seal layer 24 formed under the side walls W9 toward the position beneath the through hole 202a. In the present embodiment, each third probe 25a~25i is a cantilever probe having a needle segment 250 and a cantilever segment 251, wherein the needle segment 250 is arranged below the through hole 202a while one end of the cantilever segment 251 is electrically connected to the electrical substrate 201. Please refer to FIGS. 4B and 4D, the fourth probes 26a~26f are arranged at one side of the third probes or at two separated sides of the third probes. In the present embodiment, the fourth probes 26a~26f are divided into two groups respectively arranged at two separated sides of the third probes 25a~25i. Each forth probe 26a~26f is a cantilever probe, wherein the fourth probes 26a~26c are arranged at one side of the third probe 25a, and the fourth probes 26d~26f are arranged at the one side of the third probe 25i. In the present embodiment, the cantilever segment 261 of the forth probes 26a~26c is diagonally extended to through hole along the direction between X axis and −Y axis on the XY plane. More particularly, the cantilever segment 261 of the fourth probes 26a~26c is diagonally extended from seal layer 24 formed under the side walls W7 to the position beneath the through hole 202a such that an included angle θ9 is formed between the third central axis CL4 and the fourth central axis CL5. Likewise, the cantilever segment 261 of the fourth probes 26d~26f is diagonally extended to through hole 202a along the direction between X axis and Y axis on the XY plane. More particularly, the cantilever segment 261 of the fourth probes 26d~26f is diagonally extended from seal layer 24 formed under the side walls W8 to the position beneath the through hole 202a such that an included angle is formed between the third central axis CL4 of the fourth probes 26d~2f and the fourth central axis CL5. It is noted that a part of the cantilever segment 251 of each third probes 25a~25i from seal layer 24 to needle segment 250 and a part of the cantilever segment 261 of each fourth probes 26a~26f from seal layer 24 to needle segment 260 are arranged at the DUT side B, i.e., beneath the through hole 202a without being arranged inside the through hole 202a.

Figure 4A:
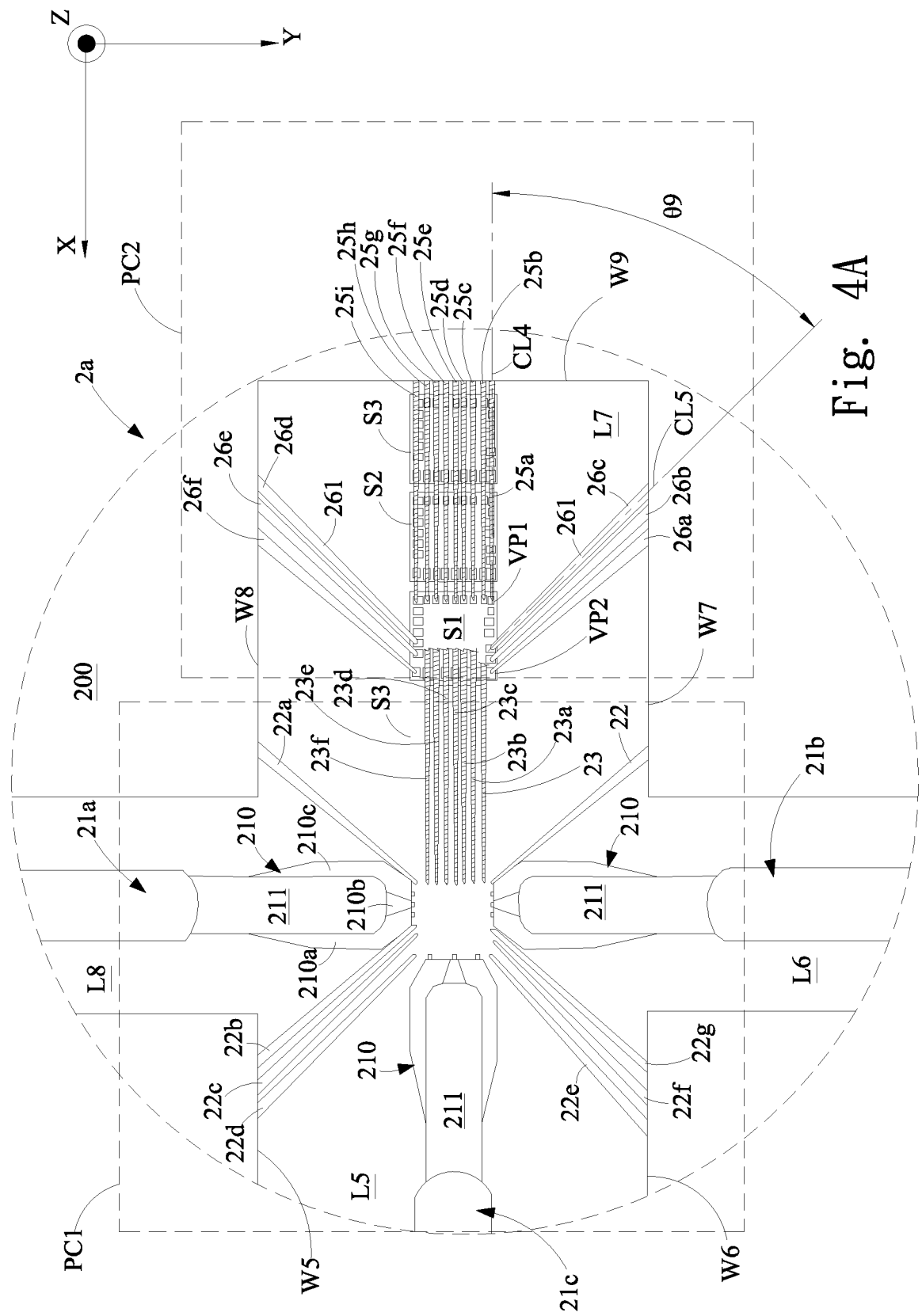
FIGS. 4A to 4C respectively illustrate another embodiment with respect to probe arrangement of the probe card of the present invention.
Figure 4B:
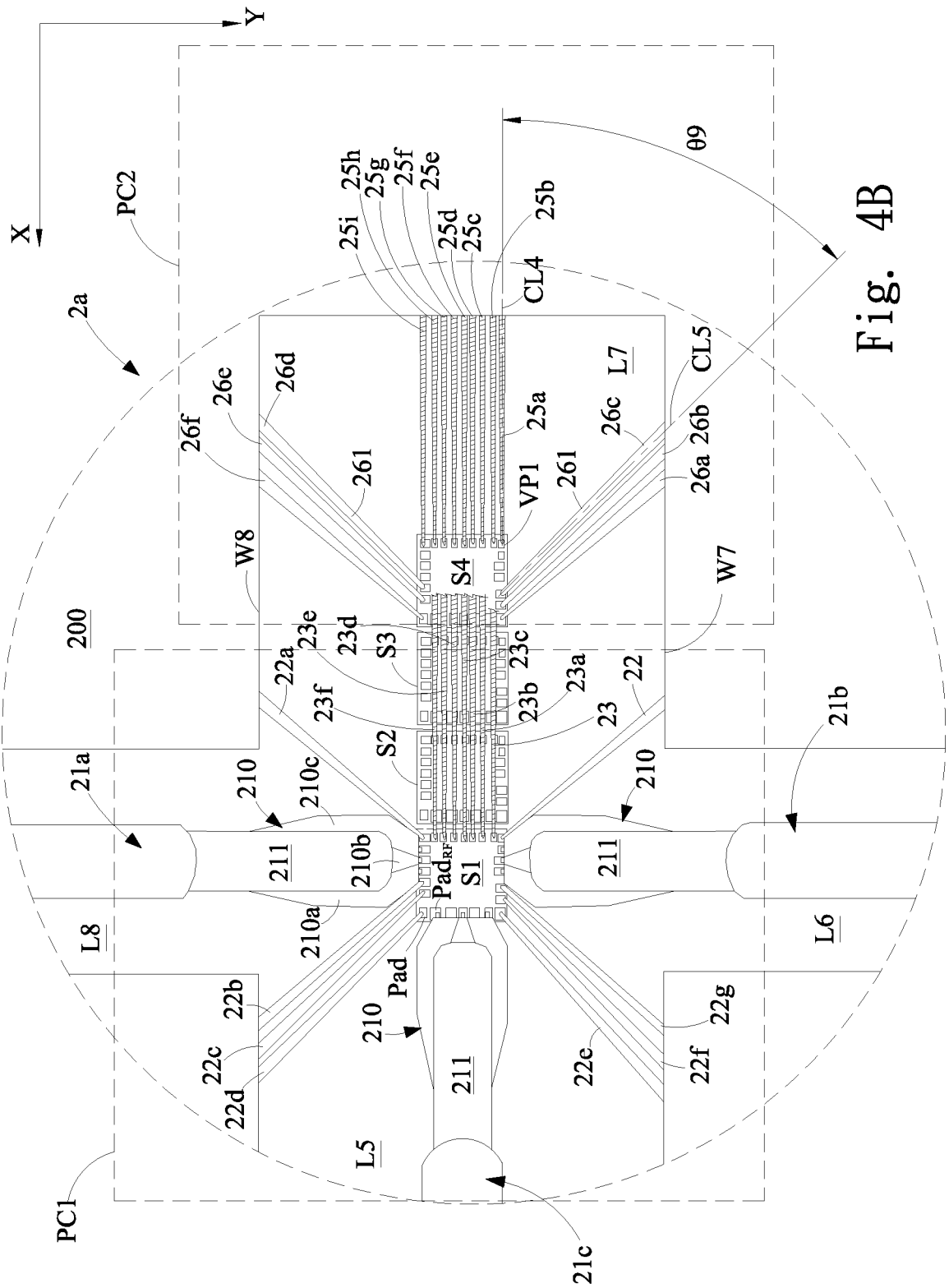
Figure 4C:
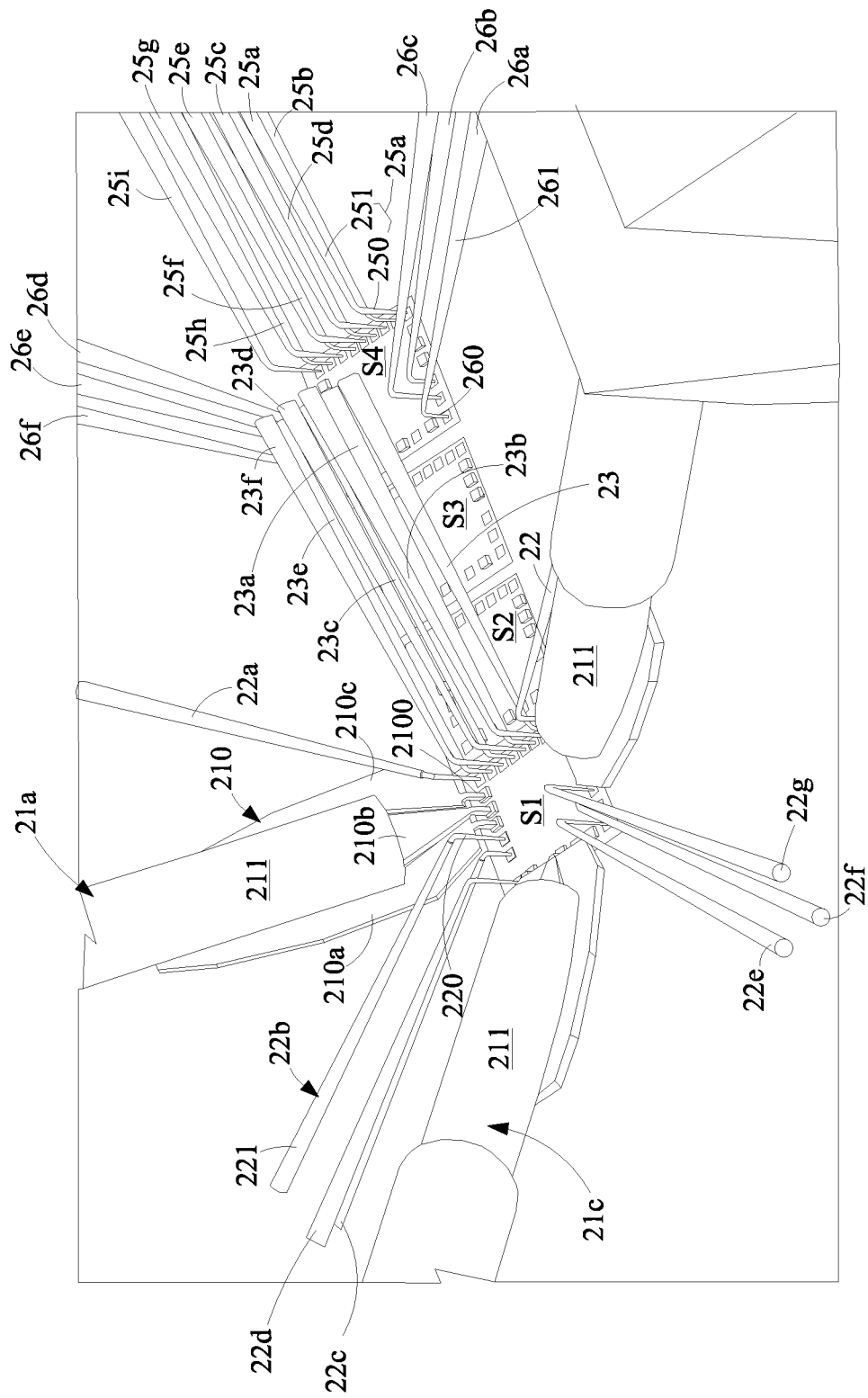
Figure 4D:
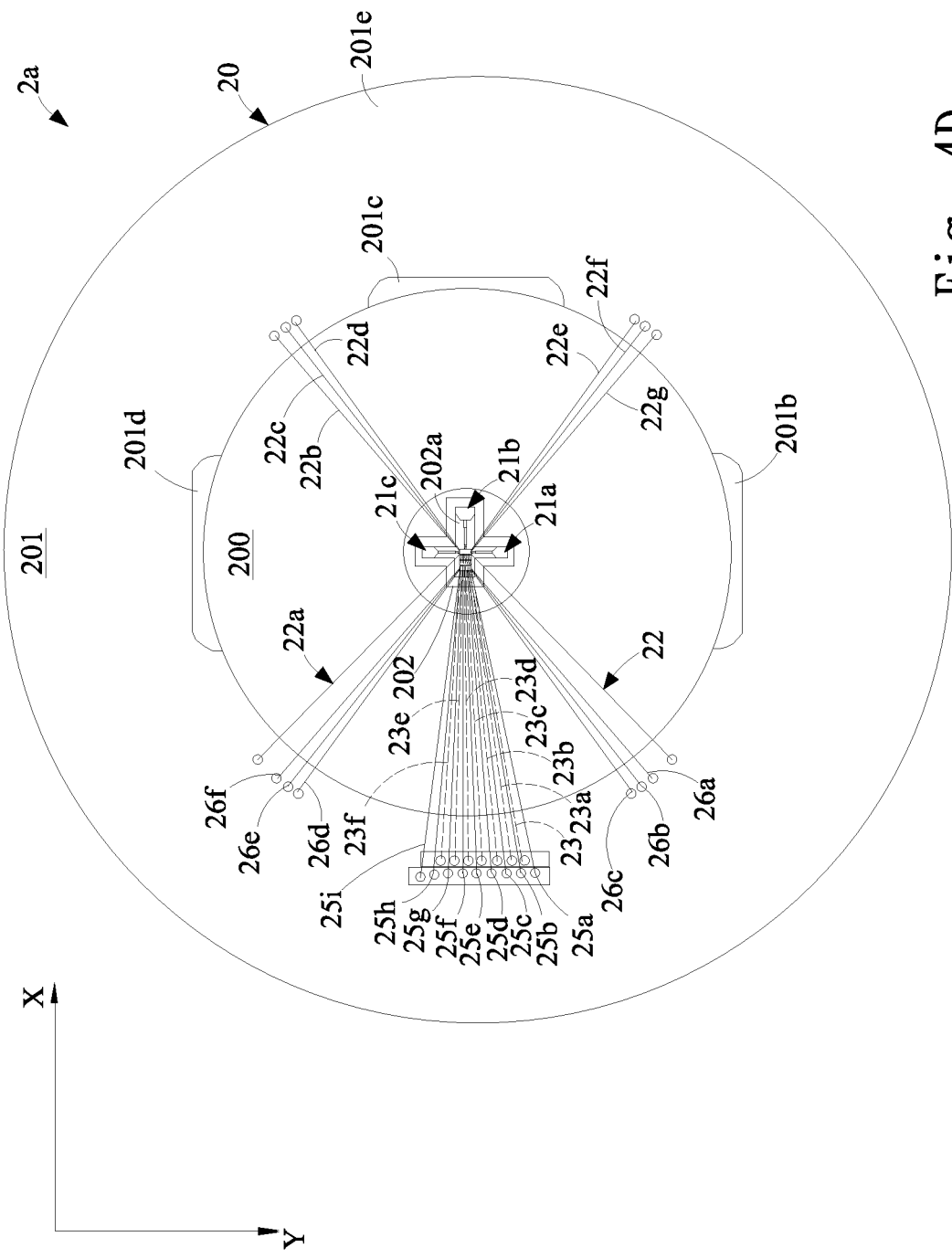
FIG. 4D illustrates a top view with respect to another embodiment of probe card of the present invention.
Figure 4E:
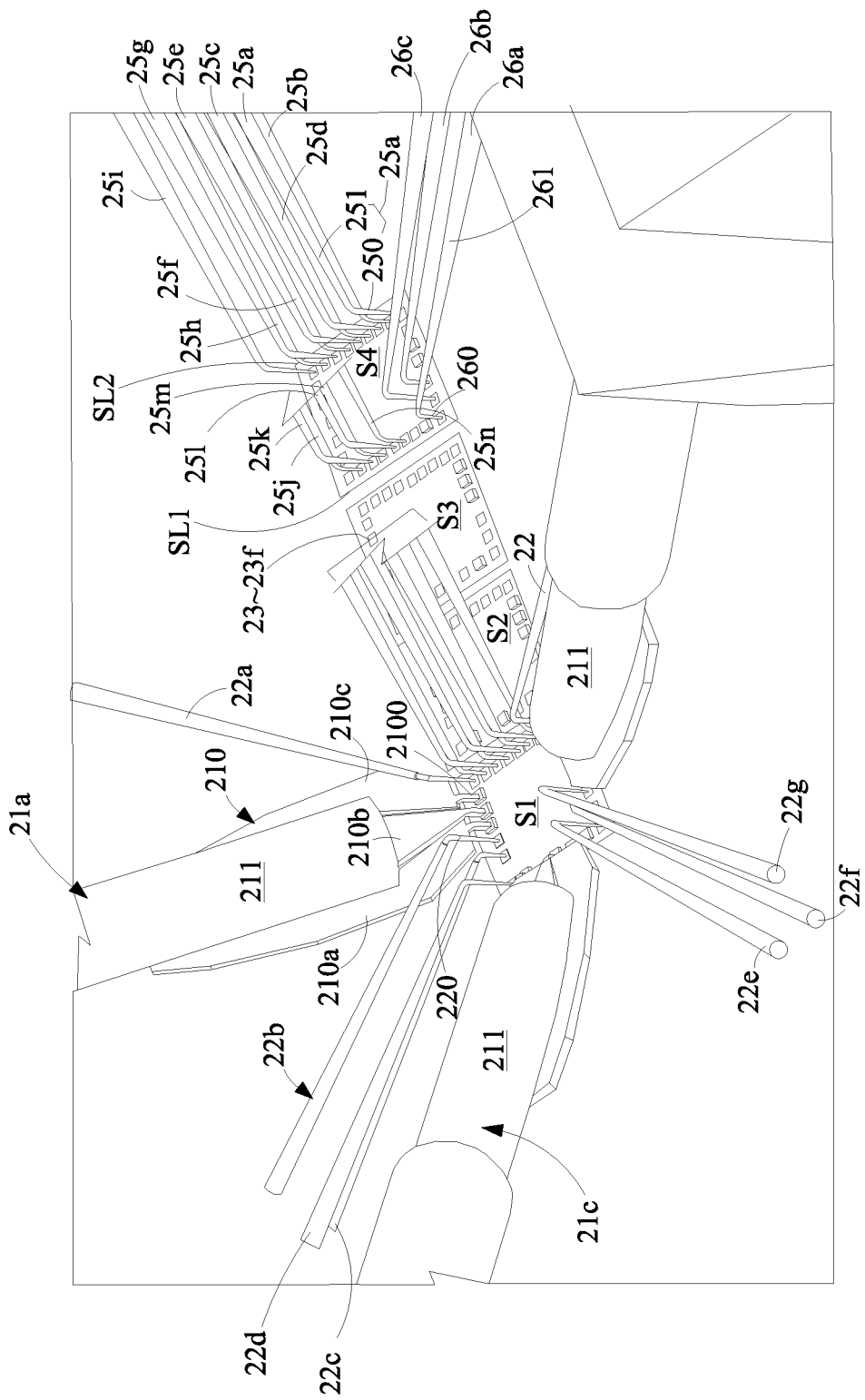
FIGS. 4E and 4F illustrate another embodiment with respect to arrangement of probe layer associated with the fourth side of the positioning structure when a RF characteristic inspection is performed on one DUT while a signal characteristic inspection is performed on another DUT.
Figure 4F:
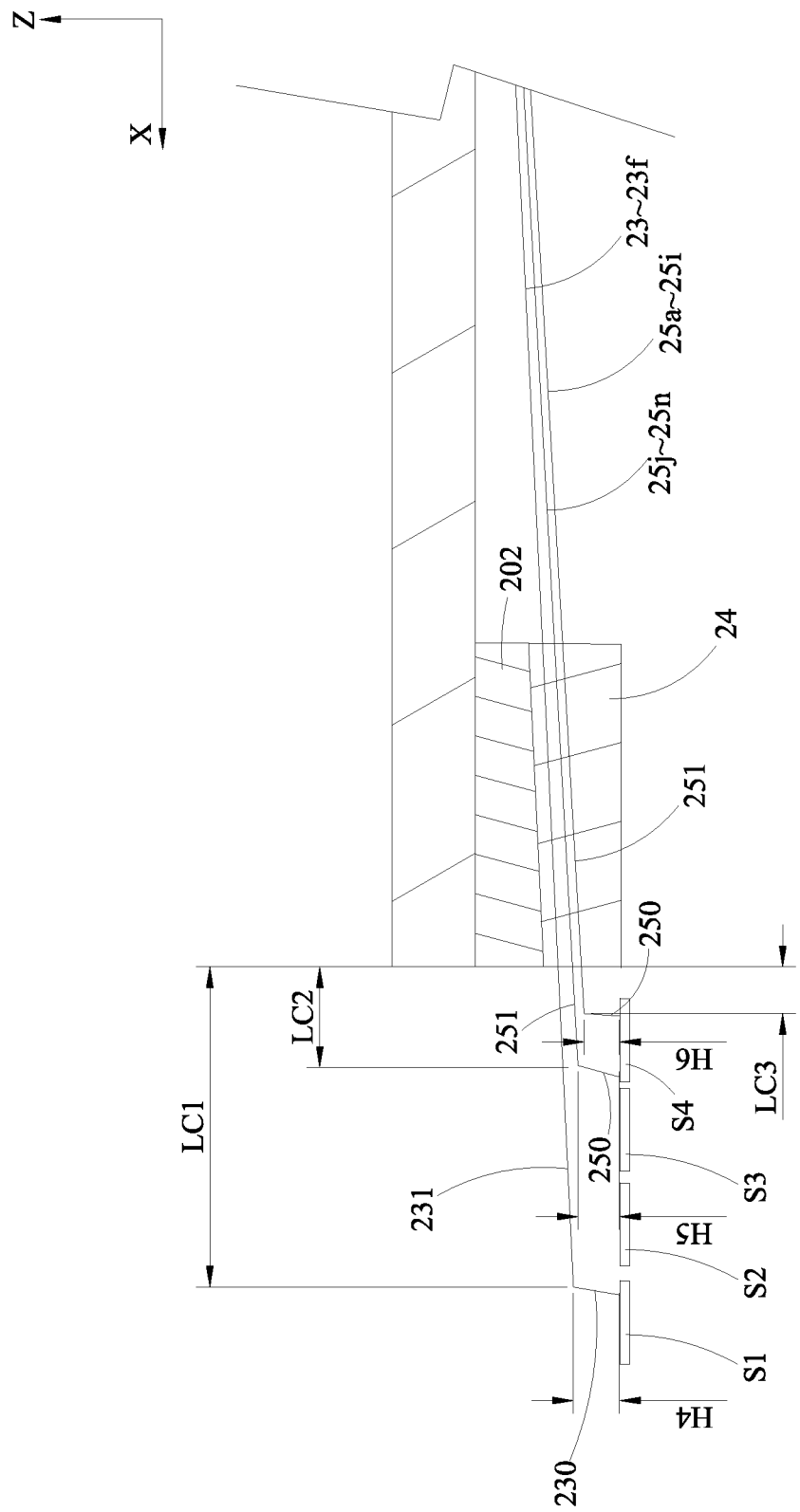
Figure 5:
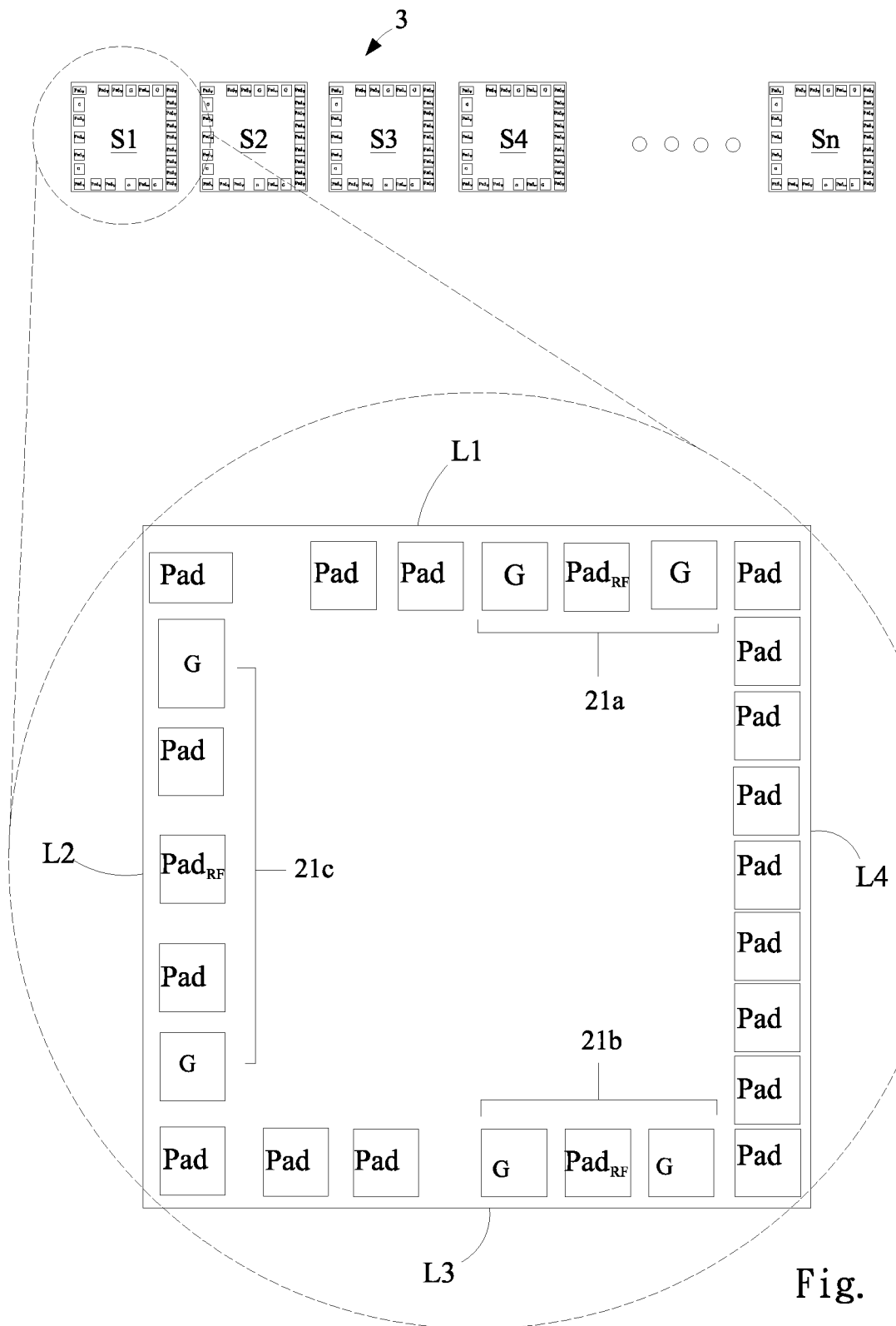
FIG. 5 illustrates DUT array according to one embodiment of the present invention.

Please refer to FIGS. 4E and 4F, which are basically similar to the embodiments shown in FIGS. 4A to 4C and the different part is that the electrical contact pads formed on the lateral sides SL1 and SL2 of DUT S4 are inspected by third probes straightly extended along the X axis. In the FIG. 4E, the first probing module PC1 is utilized to inspect the DUT S1, and the second probing module PC2 are utilized to inspect the DUT S4. From the side view shown in FIG. 4F, it can figure out the relation of layout between the second probes 23~23f and third probes 25a~25n. In the embodiment shown in FIG. 4E, the needle segment 230 of the second probes 23~23f has height H4, the needle segment 250 of the third probes 25j~25n utilized to inspect the electrical contact pads formed on the first lateral side SL1 has height H5, and the needle segment 250 of the third probes 25a~25i utilized to inspect the electrical contact pads formed on the second lateral side SL2 opposite to the first lateral side SL1 has height H6. In order to prevent the probes from interfering with other, the height relationship of the needle segment 230, 250 can be H4>H5>H6. In addition, the cantilever segment 231 of the second probes 23~23f from the end surface of the seal layer 24 to the needle segment 230 along the X axis has length LC1, the cantilever segment 251 of the third probes 25j~25n from the end surface of the seal layer 24 to the needle segment 250 along the X axis has length LC2, and the cantilever segment 251 of the third probes 25a~25i from the end surface of the seal layer 24 to the needle segment 250 along the X axis has length LC3, wherein the relationship between the length LC1, LC2, and LC3 is LC1>LC2>LC3. The cantilever segment 231, 251 of the second probes 23~23f, third probes 25j~25n, and the third probes 25a~25i from the end surface of the seal layer 24 to the needle segment 230, 250 along the X axis are layered along the Z axis, wherein the second probes 23~23f is close to the tester side A, and the third probes 25a~25i is close to the DUT side B.

According to the previously described embodiments, the probe card of the present invention can not only inspect the RF characteristics by impedance-matching probes, but also can realize the combination of impedance-matching probes and cantilever probes for simultaneously inspecting the DUTs through diagonally arranging the cantilever probes. In addition to the diagonal arrangement of cantilever probes, the needle segment of the cantilever probes is higher than the probing parts of the impedance-matching probes whereby the interference issues between the impedance-matching probes and the cantilever probes can be effectively avoided. Moreover, the throughput of the inspection can be increased by simultaneously inspect two DUTs such as inspecting signal characteristics of the one DUT while inspecting RF characteristics and signal characteristics of the other one DUT thereby improving the efficiency of inspecting DUTs.

It is noted that the term "extended" with respected to probe arrangement of each probe is referred to the direction where each signal transmitting part of the impedance-matching probe is extended to the needle segment of the probing part, or is referred to the direction where each cantilever segment of first, second, third, and fourth probes is extended from the end surface of the seal layer 24 toward the needle segment, but is not referred to the motion, instead. The needle segments of the impedance-matching probe and the cantilever probes, such as first, second, third, and fourth probes, for example, are arranged the DUT side of the probe base.

Please refer to FIGS. 2A to 2E, the probe card 2 is utilized to inspect the electrical characteristics of DUT. The probe card 2 comprises a probe base 20, at least one impedance-matching probe 21a~21c, a plurality of first probes 22~22g. The probe base 20 further has a DUT side B and a tester side A corresponding to the DUT side B. Each impedance-matching probe 21a~21c has a probing part 210 and a signal transmitting part 211 connected to the probing part 210. One end of the signal transmitting part 211 is arranged at the tester side A, and the signal transmitting part 211 passes through the through hole 202a of the probe base 20 such that the probing part 210 is arranged at the DUT side B of the probe base 20. The signal transmitting part 211 has a central probing axis CL1. The plurality of first probes 22~22g respectively have a needle segment 220 and cantilever segment 221 connected to the needle segment 220. One end of the cantilever segment 221 of each first probe 22~22g is electrically connected to the probe base 20. Please refer to FIG. 2C, one end of the cantilever segment 221 of each first probe 22~22g is electrically connected to the electrical contact pad formed on the third surface 201e of the electrical substrate 201. The needle segment 220 is arranged at the DUT side B beneath the through hole 202a. The cantilever segment 221 has a first central axis CL2. At least one side of the impedance-matching probe 21a~21c has at least one first probe 22~22g, wherein a first included angle that is greater than zero degree and smaller than 90 degree is defined between the central probing axis CL1 and first central axis CL2 of the at least one first probe 22~22g. In the present embodiment, the first included angle can be θ1, θ2 or θ3 defined by the central probing axis CL1 of the impedance-matching probe 21c and at least one of the first probe 22b~22b. More specifically speaking, the first angle θ1~θ3 defined by the central probing axis CL1 of the impedance-matching probe 21c and at least one of the first probe 22b~22b can be preferably ranged between 35~55 degrees.

The probe base 20 further comprises a supporting substrate 200, electrical substrate 201, a plurality of supporting bases 200d~200f, and a positioning structure 202. The supporting substrate 200 has a first surface 200a facing the DUT side B, a second surface 200b facing the tester side A, and a first through hole 200c running through the first surface 200a and the second surface 200b, and corresponding to the through hole 202a. The electrical substrate 201 is arranged onto the second surface 200b and comprises a second through hole 201a corresponding to the first through hole 200c. One end of the cantilever segment 221 of each first probe 22~22g is electrically connected to the electrical substrate 201. The plurality of supporting base 200d~200f is arranged within the second through hole 201a and are fixed on the second surface 200b. Each supporting base 200d~200f is corresponding to one of the impedance-matching probes 21a~21c. Each impedance-matching probe 21a~21c has a signal connector 2121 electrically connected to one end of the signal transmitting part 211 of the corresponding impedance-matching probe 21a~21c. A plurality of positioning plates 200g~200i are arranged around each supporting base 200d~200f for confining the supporting base 200d~200f to an assembly position. The positioning structure 202 has through hole 202a formed thereon for allowing the signal transmitting part 211 passing therethrough.

The needle part 210 of each impedance-matching probe 21a~21c further comprises a needle segment 2100 and connecting segment 2101 connected to the needle segment 2100. The connecting segment 2101 is electrically coupled to the signal transmitting part 211, and the height of needle segment 2100 of each impedance-matching probe 21a~21c is lower than the height of the needle segment 220 of the adjacent first probe 22~22g.

The through hole 202a has a plurality of opening slots L5~L8, and each impedance-matching probe 21a~21c is corresponding to one of the open slots L5, L6 and L8. The signal transmitting part 211 of each impedance-matching probe 21a~21c passes through the corresponding opening slots L5, L6 and L8 of the through hole 202a, and is straightly extended along first axis X or second axis Y in the opening slots L5, L6 and L8 on the XY plane, wherein one of the opening slots L5, L6, and L8 has two parallel side walls W5 and W6, and at least one of the first probes 22b~22d is diagonally extended along a direction with an included angle greater than zero degree formed between the first probe 22b~22d and the side walls W5 and W6 from side walls W5 and W6 parallel the first axis X to the DUT side of through hole 202a.

In addition, the probe card 2 further comprises a plurality of second probes 23~23f corresponding to the opening slot L7. The plurality of second probes 23~23f are straightly extended to the DUT side beneath the through hole 202a along the first axis X, wherein the central probing axis CL1 of impedance-matching probe 21c in the opening slot L5 is parallel to the second central axes CL3 of the plurality of second probes 23~23f corresponding to the opening slot L7.

The opening slot L7 further has side walls W7 and W8 respectively parallel to the first axis X. One of the opening slots L6 and L8 has two side walls respectively parallel to the second axis Y such that the signal transmitting part 211 of one of the impedance-matching probes 21a and 21b passes through the opening slots L6 and L8 of the through hole 202a. One of the first probes 22, and 22a is diagonally extended from the side walls W7 and W8 parallel the first axis X to the DUT side beneath the through 202a. More particularly, in the present embodiment, the cantilever segment 221 between the end surface of the seal layer 24 and the needle segment 220 of each first probe 22 and 22a is diagonally extended to adjacent impedance-matching probes 21a, and 21b. For example, the cantilever segment 221 between the end surface of the seal layer 24 and the needle segment 220 of first probe 22 is diagonally extended to adjacent impedance-matching probes 21b while the cantilever segment 221 between the end surface of the seal layer 24 and the needle segment 220 of first probe 22a is diagonally extended to adjacent impedance-matching probes 21a.

In addition, the opening slot L7 further comprises a side wall arranged between the two side walls W7 and W8 and perpendicular to the first axis X. The side wall of the opening slot L7 that is perpendicular to the first axis X is the side wall from which the second probes 23~23f are extended.

Please refer to FIGS. 4A to 4E and FIG. 5, the probe card 2a comprises a probe base 20, a first probing module PC1 and the second probing module PC2. The probe base 20 has a DUT side B and a tester side A opposite to the DUT side B. The first probing module PC1 is arranged on the probe base 20. The first probing module PC1 comprises at least one impedance-matching probes 21a~21c, and a plurality of first cantilever probes, such as first probes 22~22g, for example. Each impedance-matching probe 21a~21c further comprises a probing part 210 and signal transmitting part 211. The probing part 210 has at least two needle segments 2100. In the present embodiment, like FIG. 4C, the probing part 210 has three needle segments 2100 including one signal needle, and two ground needles for forming a GSG probing part. Alternatively, the needle segment 2100 can also include, but should not limited to, one signal needle and one ground needle for forming a SG probing part, two signal needles and two ground needles for forming a GSSG probing part, or two signal needles and three ground needles for forming a GSGSG probing part. Therefore, the quantity of the needle segments of the probing part 210 can be two or more for inspecting the RF characteristics of DUTs. The signal transmitting part 211 is connected to the probing part 210. Each first cantilever probe comprises a needle segment 220, and a cantilever segment 221 connected to the needle segment 220. The needle segment 2100 of the impedance-matching probes 21a~21c and the needle segments 220 of the first cantilever probes, e.g., first probes 22~22g, forms a first probing area. Please refer to FIGS. 4B and 4C, wherein the first probing area in the present embodiment is referred to the area formed by electrical contact pads (Pad) of DUT S1 that is enclosed by the needle segment 2100 of the impedance-matching probes 21a~21c and the needle segments 220 of the first cantilever probes. The second probing module PC2 is arranged on the probe base 20 and is arranged at one side of the first probing module PC1. In the present embodiment shown as FIG. 4A, the second probing module PC2 is located at the −X side of the first probing module PC1 on the XY plane. The second probing module PC2 further comprises a plurality of second cantilever probes, such as third probes 25a~25i and the fourth probes 26a~26f, for example. Each second cantilever probe has needle segment 250, 260 and cantilever segment 251 and 261. The cantilever segments 251 and 261 are connected to the needle segments 250 and 260, respectively. The needle segments 250 and 260 of the plurality of the second cantilever probes constitute the second probing area. In the present embodiment shown in FIGS. 4B and 4C, the second probing area in the present embodiment, is referred to the area formed by electrical contact pads (Pad) of DUT S4 that is enclosed by the needle segment 250 of the third probes 25a~25i, and the needle segments 260 of the fourth probes 26a~26f. The distance between the first probing area and the second probing area is larger than the distance between any two of the needle segments 250 and 260 of the second cantilever probes. More specifically speaking, the distance along X axis between the first and the second probing areas is larger than distance between any two needle segments of cantilever probes, e.g., the fourth probes 26a and 26f.

The needle segments 2100 and 210 with respect to at least one impedance-matching probes 21a~21c and the first cantilever probes of the first probing module PC1 are utilized to inspect the electrical contact pad of one DUT, such as electrical contact pads of DUT S1 shown in FIGS. 4B and 4C. The needle segments 250 and 260 with respect to the second cantilever probes, such as third probes 25a~25i and fourth probes 26a~26f of the second probing module PC2 are utilized to inspect the electrical contact pads of another DUT, such as electrical contact pads of DUT S4 shown in FIGS. 4B and 4C. Please refer to FIGS. 4B and 4C, the definition of distance between the first probing area and the second probing area is referred to the distance between a lateral side of the first probing area close to second probing area, i.e., the lateral side adjacent to −X direction, and the lateral side of the second probing area close to the first probing area, i.e., the lateral side adjacent to X direction, along the first axis X. More specifically speaking, in the present embodiment, the probe card 2a is utilized to inspect a plurality of DUTs such as dies, for example. The DUTs S1~S4 shown in FIGS. 4B and 4C are regarded as exemplary representatives for understanding the implement of the present embodiment. The dimension and relative position between the electrical contact pads of each DUT are the same as each other. When the probe card 2a is utilized to inspect the DUTs, the needle segments with respect to the first probing area or the second probing area should electrically contact with the electrical contact pads of the DUTs. Accordingly, the dimension of the first probing area is roughly the same as dimension of the second probing area. The term "roughly the same" is referred to consider the error in manufacturing probes with respect to the first and second probing areas or arranged position error of needle segment when maintenance of the probe card 2a is performed. In the present embodiment, the distance between the first and the second probing areas is larger than a width of at least one DUT along the first axis X. Please refer to FIGS. 4B, 4C and 4E, the distance between the first and the second probing areas is larger than width of DUT S2 and S3 along the first axis X which means that the distance between the first and the second probing areas is larger than the width of the two DUTs along the first axis X. Taking DUT S4 as an example, the width of the DUT along first axis X is referred to the width between the first lateral side SL1 and second lateral side SL2 of the DUT S4. There has cutting trails (not shown) between any two DUTs. As shown in FIGS. 4B, 4C and 4E, the width of the second probing area is smaller than or equal to the width of the DUT S4 along the first axis X. Therefore, the distance between the first probing area and the second probing area is larger then the width of the second probing area along the first axis X. It is noted that the width of the second probing area along the first axis X is referred to distance between two opposite lateral sides of the second probing area along the first axis X, i.e. the distance between the lateral side of the second probing area that is close to the first probing area and the lateral side of the second probing area that is far away from the first probing area. As shown in FIGS. 4B, 4C and 4E, the two lateral sides of the second probing area are close to the lateral sides SL1 and SL2 of the DUT S4, respectively.

In the embodiment shown in FIGS. 4B to 4E, one end of the signal transmitting part 211 arranged at the tester side A passes through the through hole 202a of the probe base 20 such that the probing part 210 is arranged at the DUT side B of the probe base 20. Please refer to FIGS. 2A to 2E which illustrates the impedance-matching probes 21a~21c and first probes 22~22g. The signal transmitting part 211 has central probing axis CL1, and the plurality of cantilever probes comprises the first probes 22~22g wherein one end of the cantilever segment 221 of each first probe 22~22g is electrically connected to the probe base 20. More specifically speaking, as shown in FIG. 1A, one end of the cantilever segment 221 of first probes 22~22g is electrically connected to the third surface 201e of the electrical substrate 201 whereas the needle segment 220 of each first probe 22~22g is arranged at the DUT side B beneath the through hole 202a. The cantilever segment 221 of each first probe 22~22g has a first central axis CL2. At least one side of the impedance-matching probe 21a~21c has at least one first probe 22~22g, wherein a first included angle that is greater than zero degree and smaller than 90 degree is defined between the central probing axis CL1 and first central axis CL2 of the at least one first probe 22~22g. In the present embodiment, the first included angle can be θ1, θ2 or θ3 defined by the central probing axis CL1 of the impedance-matching probe 21c and at least one of the first probes 22b~22g. More particularly, the first angle θ1~θ3 defined by the central probing axis CL1 of the impedance-matching probe 21c and at least one of the first probes 22b~22g can be preferably ranged between 35~55 degrees.

In the embodiment shown in FIGS. 4B-4E, the through hole 202a has a plurality of opening slots L5~L8, and each impedance-matching probe 21a~21c is corresponding to one of the opening slots L5, L6 and L8. The signal transmitting part 211 of each impedance-matching probe 21a~21c passes through the corresponding opening slots L5, L6 and L8 of the through hole 202a, and is straightly extended along first axis X or second axis Y in the corresponding opening slots L5, L6 and L8, wherein the opening slots L5 has two side walls W5 and W6 parallel to the first axis X, and at least one of the first probes 22b~22g is diagonally extended to DUT side B of through hole 202a between the side walls W5 and W6 along the first axis X.

In addition, in another embodiment, the first cantilever probes of the probe card 2 further comprises a plurality of second probes 23~23f corresponding to the opening slot L7. The plurality of second probes 23~23f are straightly extended to the DUT side B beneath the through hole 202a along the first axis X, and one end of the cantilever segment 231 of each second probe 23~23f is electrically connected to the probe base 20. As shown in FIG. 1A, more specifically speaking, one end of the cantilever segment 231 of each second probe 23~23f is electrically connected to the third surface 201e of the electrical substrate 201, wherein the central probing axis CL1 of impedance-matching probe 21c in the opening slot L5 which is opposite to the opening slot L7 corresponding to the second probes 23~23f is parallel to the second central axes CL3 of the plurality of second probes 23~23f.

The second cantilever probes of the probe card 2a further comprises a plurality of third probes 25a~25n extended to the DUT side B under the through hole 202a along the first axis X. In addition, the two opposite sides of the plurality of third probes 25a~25n respectively have a plurality of fourth probes 26a~26f, wherein the cantilever segment 251 of each third probe 25a~25n has the third central axis CL4, the cantilever segment 261 of each fourth probe 26a~26f has the fourth central axis CL5, and a second included angle θ9 larger than zero degree and smaller than 90 degree is formed between at least one third central axis CL4 and at least one fourth axis CL5. Specifically, the second angel θ9 can be preferably ranged between 35~55 degrees.

Please refer embodiment shown in FIGS. 4B to 4E, the probe base 20 is the same as structure illustrated in FIGS. 1A and 1B. The probe base 20 further comprises supporting substrate 200, electrical substrate 201, a plurality of supporting base 200d~200f, and a positioning structure 202. The supporting substrate 200 comprises a first surface 200a facing the DUT side B, a second surface 200b facing the tester side A, and a first through hole 200c running through the first surface 200a and the second surface 200b such that the through hole 202a is corresponding to the first through hole 200c. The electrical substrate 201 is arranged onto the second surface 200b. The electrical substrate 201 has a second through hole 201a corresponding to the first through hole 200c. One end of each cantilever segment 221 of the plurality of first probes 22~22g is electrically connected to the electrical substrate 201. The plurality of supporting bases 200d~200f are arranged within the second through hole 201a, and are fixed onto the second surface 200b. Each supporting base 200d~200f is corresponding to one of the impedance-matching probes 21a~21c. Each impedance-matching probe 21a~21c has a signal connector 2121 electrically connected to the signal transmitting part 211 of the corresponding impedance-matching probes 21a~21c. The positioning structure 202 is disposed on the first surface 200a of the supporting substrate 200 and has a through hole 202a allowing the signal transmitting part 211 of each impedance-matching probe 21a~21c passing therethrough. Please refer to FIG. 2C, which partially illustrates the positioning structure 202 and the first probes 22~22g. In one embodiment, the positioning structure 202 has a connecting surface 202b and a supporting surface 202c in which the connecting surface 202b is connected to the first surface 200a, and a seal layer is formed on the supporting surface 202c, wherein a part of the cantilever segment 221 of the first probes 22~22g is covered by the seal layer 24.

It is noted that the first central axis CL2 is defined according to the cantilever segment 221 of the first probes 22~22g from end surface of the seal layer 24 to the needle segment 220, the second central axis CL3 is defined according to the cantilever segment 231 of the second probes 23~23f from end surface of the seal layer 24 to the needle segment 230, the third central axis CL4 is defined according to the cantilever segment 251 of the third probes 25a~25n from end surface of the seal layer 24 to the needle segment 250, and the fourth central axis CL5 is defined according to the cantilever segment 261 of the fourth probes 26a~26f from end surface of the seal layer 24 to the needle segment 260.

In one embodiment, a plurality of positioning plates 200g~200i are surround each supporting base 200d~200f for confining the supporting base 200d~200f to an assembly position thereby ensuring the supporting base 200d~200f can be firmly fixed on the second surface 200b.

In the embodiments shown in FIGS. 4B to 4F, the needle segment 230 of each second probe 23~23f has first height H4. The needle segment 250 of a part of the plurality of third probes 25a~25n has second height H5. For example, the needle segment 250 of the third probes 25j~25n has second height H5. The needle segment 250 of another part of the third probes 25a~25n has a third height H6. For example, the needle segment of the third probes 25a~25i has third height H6. The needle segments 250 having the second height H5 are utilized to electrically contact with the electrical contact pads formed on the first lateral side of the DUT. In the present embodiment, the needle segments 250 having the second height H5 of the third probes 25j~25n are electrically contacted with the electrical contact pads formed on the first lateral side SL1 of the DUT S4. The needle segments 250 having the third height H6 are utilized to electrically contact with the electrical contact pads formed on the second lateral side opposite to the first lateral side of the DUT. In the present embodiment, the needle segments 250 having the third height H6 of the third probes 25a~25i are electrically contacted with the electrical contact pads formed on the second lateral side SL2 opposite to the first lateral side SL1 of the DUT S4, wherein the first height H4 is larger than the second height H5, and the second height H5 is larger than the third height H6.

Please refer to the embodiment shown in FIGS. 4B to 4F as well as the positioning structure 202 shown in FIG. 2A, a seal layer 24 is formed at the DUT side B of the probe base 20. A part of the cantilever segment 221 of the plurality of first probes 22~22g is covered by the seal layer 24. In addition, a part of the cantilever segment 231 of the second probes 23~23f, a part of the cantilever segment 251 of the third probes 25a~25n, and a part of the cantilever segment 261 of the fourth probes 26a~26f are covered by the seal layer 24. In addition, the cantilever segment 231 of the second probes 23~23f from the end surface of the seal layer 24 to the needle segment 230 along the X axis has first length LC1, the cantilever segment 251 of a part of the third probes 25a~25n from the end surface of the seal layer 24 along the X axis has second length LC2, e.g., the cantilever segments 251 of the third probes 25j~25n from the end surface of the seal layer 24 along first axis X having the second length LC2, and the cantilever segments of another part of the third probes 25a~25n from the end surface of the seal layer 24 along the X axis has third length LC3, e.g., the cantilever segments 251 of the third probes 25a~25i from the end surface of the seal layer 24 along first axis X having the third length LC3. Each cantilever segment 251 having the second length LC2 is connected to the needle segment 250 having the second height H5 for electrically contacting the electrical contact pads formed on the first lateral side of the DUT. For example, as shown in FIGS. 4B to 4F, the cantilever segment 251 of the third probes 25j~25n having the second length LC2 is connected to the needle segment 250 having the second height H5 for inspecting the electrical contact pads formed on the first lateral side SL1 of DUT S4. Each cantilever segment 251 having the third length LC3 is connected to the needle segment 250 having third height H6 for electrically contacting the electrical contact pads formed on the second lateral side opposite to the first lateral side of the DUT. For example, as shown in FIGS. 4B to 4F, the cantilever segment 251 of the third probes 25a~25i having the third length LC3 is connected to the needle segment 250 having the third height H6 for inspecting the electrical contact pads formed on the second lateral side SL2 opposite to the first lateral side SL1 of the DUT S4. The first length LC1 is longer than the second length LC2 and the second length LC2 is longer than the third length LC3.

It is noted that the first angle and the second angle are respectively ranged between zero degree and 90 degree. More preferably, the range is between 35 degrees to 55 degrees. It is also noted that the shape and the spatial arrangement of the electrical contact pads of the DUT corresponding to the first central axis CL2 of the first probes 22b~22g are the main point of design such that the contact traces formed by the needle segment 220 of the first probes 22b~22g could be within the predetermined range with respect to the electrical contact pads.

While the present invention has been particularly shown and described with reference to a preferred embodiment, it will be understood by those skilled in the art that various changes in form and detail may be without departing from the spirit and scope of the present invention. In the present invention, the quantity of the DUTs is not the limitation to define the distance between the first and second probing areas. In another word, it is also available to define the distance between the first and the second probing areas without using the DUTs (S1~D4). For example, in one embodiment, the distance between the first probing area and the second probing area could be defined by the distance between any one needle segment of the first probing module PC1, such as needle segment 230 of the second probe 23, and any one needle segment of the second probing module PC2, such as needle segment 260 of the fourth needle 26.

What is claimed is:

1. A probe card for inspecting electrical characteristic of a DUT, comprising:
    a probe base, having a DUT side and a tester side opposite to the DUT side;
    at least one impedance-matching probe, each impedance-matching probe comprising a probing part and a signal transmitting part electrically connected to the probing part, wherein one end of the signal transmitting part is arranged at the tester side, the signal transmitting part passes through a through hole of the probe base, and the signal transmitting part has a central probing axis; and
    a plurality of first probe, each first probe comprising a needle segment and a cantilever segment connected to the needle segment, wherein one end of the cantilever segment of each first probe is electrically connected to the probe base, each needle segment is arranged at the DUT side corresponding to the through hole, and each cantilever segment has a first central axis;
    wherein at least one side of each impedance-matching probe has at least one first probe, and a first included angle larger than zero degree is formed between the central probing axis and the first central axis;
    wherein the through hole further comprises a plurality of opening slots, each impedance-matching probe is corresponding to one of the opening slots, and the signal transmitting part of each impedance-matching probe is configured to pass through corresponding opening slot and is straightly extended along a first axis or a second axis.

2. The probe card of claim 1, wherein the probe base further comprising:
    a supporting substrate, having a first surface facing the DUT side, a second surface facing the tester side, and a first through hole running through the first and second surfaces such that the through hole is corresponding to the first through hole;
    an electrical substrate, arranged at the second surface, the electrical substrate comprising a second through hole corresponding to the first through hole, wherein one end of the cantilever segment of each first probe is electrically connected to the electrical substrate;
    a plurality of supporting bases, configured to be arranged within the second through hole and be fixed on the second surface, each supporting base corresponding to one of the impedance-matching probes, wherein each impedance-matching probe has a signal connector electrically coupled to one end of the signal transmitting part of the corresponding impedance-matching probe; and a positioning structure, configured to be arranged on the first surface of the supporting substrate, the positioning structure comprising the through hole provided for the signal transmitting part of each impedance-matching probe passing therethrough.

3. The probe card of claim 2, wherein a plurality of positioning plates are surround each supporting base configured to confine the supporting base to an assembly position.

4. The probe card of claim 1, wherein the probing part of each impedance-matching probe further comprises a probing segment and a connecting segment electrically coupled to the probing segment and the signal transmitting part, wherein a height of the probing segment of each impedance-matching probe is smaller than a height of the needle segment of each adjacently arranged first probe.

5. The probe card of claim 1, wherein one of the opening slots further comprises two side walls parallel to the first axis, and at least one of the first probes is diagonally extended to the DUT side of the through hole from the side wall along the first axis so as to form an included angle larger than zero degree with the side wall.

6. The probe card of claim 1, further comprising a plurality of second probes corresponding to another one of the opening slots, and the plurality of second probes are straightly extended to the DUT side of the through hole along the first axis, wherein the central probing axis of the impedance-matching probe within the opening slot opposite to the opening slot corresponding to the second probes is parallel to a second central axis of the each second probe.

7. The probe card of claim 1, wherein the first included angle is ranged between 35 degrees to 55 degrees.

8. A probe card, comprising:
a probe base, configured to have a DUT side and a tester side opposite to the DUT side;
a first probing module, configured to be arranged onto the probe base, wherein the first probing module further comprises:
at least one impedance-matching probe, each impedance-matching probe further comprising:
a probing part, configured to have at least two probing segments; and
a signal transmitting part, electrically coupled to the probing part, the signal transmitting part passing through a through hole of the probe base such that the probing part is arranged at the DUT side of the probe base, wherein the through hole further comprises a plurality of opening slots, each impedance-matching probe is corresponding to one of the opening slots, and the signal transmitting part of each impedance-matching probe is configured to pass through corresponding opening slot and is straightly extended along a first axis or a second axis;
a plurality of first cantilever probes, each first cantilever probe comprising:
a needle segment; and
a cantilever segment, connected to the needle segment;
wherein a first probing area is formed by the probing part of the at least one impedance-matching probe, and the needle segments of the first cantilever probes; and a second probing module, arranged on the probe base and at a side of the first probing module, the second probing module comprising:
a plurality of second cantilever probes, each of the second cantilever probe comprising:
a needle segment; and
a cantilever segment, connected to the needle segment;
wherein a second probing area is formed by the needle segments of the plurality of second cantilever probes;
wherein a distance between the first probing area and the second probing area is greater than a distance between two needle segments of any two second cantilever probes.

9. The probe card of claim 8, wherein one end of the signal transmitting part having a central probing axis is arranged at the tester side and the first cantilever probe further comprises a plurality of first probes, each of which comprises a needle segment arranged at the DUT side of the through hole and a cantilever segment having a first central axis and connected to the needle segment, wherein at least one side of each impedance-matching probe has the at least one first probe, and a first included angle larger than zero degree is formed between the central probing axis and the first central axis.

10. The probe card of claim 8, wherein one of the opening slots further comprises two side walls parallel to the first axis, and at least one of the first probes is diagonally extended to the DUT side corresponding to the through hole from the side wall along the first axis.

11. The probe card of claim 9, wherein the plurality of first cantilever probes further comprise a plurality of second probes corresponding to one of the opening slots, and the plurality of second probes are straightly extended to the DUT side of the through hole along the first axis, wherein one end of a cantilever segment of each second probe is electrically connected to the probe base, and the central probing axis of the impedance-matching probe within the opening slot opposite to the opening slot corresponding to the second probes is parallel to a second central axis of the each second probe.

12. The probe card of claim 11, wherein the plurality of the second cantilever probes further comprises a plurality of third probes straightly extended to the DUT side of the through hole along the first axis, and two lateral sides of the plurality of third probes respectively have a plurality of fourth probes wherein a cantilever segment of each third probe has a third central axis, a cantilever segment of each fourth probe has a fourth central axis, and a second included angle larger than zero degree is formed between the third central axis and the fourth central axis.

13. The probe card of claim 9, wherein the probe base further comprises:
a supporting substrate, configured to have a first surface facing the DUT side, a second surface facing the tester side, and a first through hole running through the first and second surfaces such that the through hole is corresponding to the first through hole;
an electrical substrate, arranged at the second surface, the electrical substrate comprising a second through hole corresponding to the first through hole, wherein one end of the cantilever segment of each first probe is electrically connected to the electrical substrate;
a plurality of supporting base, configured to be arranged within the second through hole and fixed on the second surface, each supporting base corresponding to one of the impedance-matching probes, wherein each impedance-matching probe has a signal connector electrically coupled to one end of the signal transmitting part of the corresponding impedance-matching probe; and a positioning structure, configured to be arranged on the first surface of the supporting substrate, the positioning structure comprising the through hole provided for the signal transmitting part of each impedance-matching probe passing therethrough.

14. The probe card of claim 13, wherein the positioning structure further comprises a connecting surface connected to the first surface and a supporting surface having a seal layer formed thereon, wherein a part of the cantilever segment of each first probe is covered by the seal layer.

15. The probe card of claim 13, further comprising a plurality of positioning plates arranged around each supporting base for confining each supporting base to an assembly position.

16. The probe card of claim 12, wherein a needle segment of each second probe has a first height, a needle segment of a part of the third probes has a second height while a needle segment of another part of third probes has a third height, the needle segments having the second height are utilized to probe a plurality of electrical contact pads formed on a first lateral side of a DUT, and the needle segments having third height are utilized to probe a plurality of electrical pads formed on a second lateral side opposite to the first side of the DUT, wherein the first height is larger than the second height, and the second height is larger than the third height.

17. The probe card of claim 12, wherein a seal layer is formed on the probe base at the DUT side, a part of the cantilever segment of each second and third probe is covered by the seal layer, the cantilever segment of each second probe along the first axis from an end surface of the seal layer has a first length, the cantilever segment of one part of third probes along the first axis from the end surface of the seal layer has a second length, the cantilever segment of the other part of third probes along the first axis from the end surface of the seal layer has a second length, the needle segments having the second height are respectively connected to the cantilever segments having the second length for probing a plurality of electrical contact pads formed on a first side of a DUT, and the needle segments having third height are respectively connected to the cantilever segments having the third length for probing a plurality of electrical contact pads formed on a second lateral side opposite to the first side of the DUT, wherein the first length is larger than the second length, and the second length is larger than the third length.

18. The probe card of claim 9, wherein the first included angle is ranged between 35 degrees to 55 degrees.

* * * * *